(12) United States Patent
Lam et al.

(10) Patent No.: US 10,520,536 B2
(45) Date of Patent: Dec. 31, 2019

(54) APPARATUS FOR PREDICTING A MAXIMUM OPERATIONAL DEPTH FOR AN UNDERGROUND DRILLING PROCEDURE AND METHOD

(71) Applicant: Merlin Technology Inc., Kent, WA (US)

(72) Inventors: Loc Viet Lam, Renton, WA (US); Albert W. Chau, Woodinville, WA (US)

(73) Assignee: Merlin Technology Inc., Kent, WA (US)

( * ) Notice: Subject to any disclaimer, the term of this patent is extended or adjusted under 35 U.S.C. 154(b) by 0 days.

(21) Appl. No.: 14/277,873

(22) Filed: May 15, 2014

(65) Prior Publication Data
US 2014/0247059 A1 Sep. 4, 2014

Related U.S. Application Data

(62) Division of application No. 12/497,990, filed on Jul. 6, 2009, now Pat. No. 8,729,901.

(51) Int. Cl.
*G01R 29/26* (2006.01)
*G01V 3/15* (2006.01)

(52) U.S. Cl.
CPC ............... *G01R 29/26* (2013.01); *G01V 3/15* (2013.01)

(58) Field of Classification Search
CPC .................................. G01R 29/26; G01V 3/15
(Continued)

(56) References Cited

U.S. PATENT DOCUMENTS 2,251,817 A   8/1941   Athy et al.
3,292,143 A   12/1966  Russell
(Continued)

FOREIGN PATENT DOCUMENTS

EP   0873465      3/2002
JP   02-021289    1/1990
(Continued)

OTHER PUBLICATIONS

Simon et al, Digital Communication Techniques, 1995, PTR Prentice Hall, Englewood Cliffs, New Jersey 07632, Chapter 4, p. 178-201.
(Continued)

*Primary Examiner* — Jay Patidar
(74) *Attorney, Agent, or Firm* — Pritzkau Patent Group, LLC

(57) ABSTRACT

A portable device and associated method are described for use with a system in which a locating signal is transmitted from within the ground during an operational procedure. The locating signal includes a transmission frequency that is selectable from a group of discrete transmission frequencies in a frequency range and the region includes electromagnetic noise that can vary. The portable device includes a receiver having a bandwidth that includes the transmission frequency range and is operable for measuring the electromagnetic noise in the transmission frequency range to establish a frequency content of the electromagnetic noise for use in selecting one of the discrete transmission frequencies that is subsequently transmitted as the locating signal during the operational procedure. The locating signal can be transmitted from a boring tool, a pullback arrangement or an inground cable. A predicted maximum operational depth for a transmitter can be determined prior to the operational procedure.

17 Claims, 16 Drawing Sheets

(58) Field of Classification Search
USPC .......................................................... 324/329
See application file for complete search history.

(56) References Cited

U.S. PATENT DOCUMENTS

| | | | |
|---|---|---|---|
| 3,402,348 | A | 9/1968 | Hoehn et al. |
| 4,041,443 | A | 8/1977 | Thigpen |
| 4,351,027 | A | 9/1982 | Gay et al. |
| 4,608,480 | A | 8/1986 | Bizot et al. |
| 4,636,758 | A | 1/1987 | Mettoudi |
| 5,204,673 | A | 4/1993 | Kyle |
| 5,361,029 | A * | 11/1994 | Rider ................... G01R 31/023 324/326 |
| 5,633,589 | A | 5/1997 | Mercer |
| 5,963,042 | A | 10/1999 | Suyama |
| 6,005,532 | A | 12/1999 | Ng |
| 6,285,190 | B1 | 9/2001 | Brune et al. |
| 6,417,666 | B1 | 7/2002 | Mercer |
| 6,496,008 | B1 | 12/2002 | Brune et al. |
| 6,606,032 | B1 | 8/2003 | Fling |
| 6,727,704 | B2 * | 4/2004 | Brune ....................... E21B 7/04 175/45 |
| 6,737,867 | B2 * | 5/2004 | Brune ....................... G01V 3/38 324/326 |
| 6,756,783 | B2 | 6/2004 | Brune et al. |
| 6,985,750 | B1 | 1/2006 | Vicknair et al. |
| 7,106,194 | B2 | 9/2006 | Nelson |
| 7,151,375 | B2 | 12/2006 | Mercer et al. |
| 7,242,225 | B2 | 7/2007 | Klage |
| 7,331,409 | B2 | 2/2008 | Cole et al. |
| 7,495,445 | B2 | 2/2009 | Mercer |
| 7,624,816 | B2 | 12/2009 | Cole et al. |
| 7,926,589 | B2 * | 4/2011 | Mercer ................... E21B 7/046 175/45 |
| 8,305,229 | B1 | 11/2012 | Gard |
| 8,729,901 | B2 * | 5/2014 | Lam ....................... G01R 29/26 324/329 |
| 8,981,780 | B2 | 3/2015 | Cole et al. |
| 9,274,243 | B2 | 3/2016 | Chau et al. |
| 9,540,879 | B2 | 1/2017 | Kolpack |
| 2002/0105331 | A1 | 8/2002 | Brune et al. |
| 2006/0055556 | A1 | 3/2006 | Memarzadeh |
| 2006/0132136 | A1 * | 6/2006 | Mizuno ................... E21B 7/046 324/326 |
| 2007/0040558 | A1 * | 2/2007 | Overby ....................... F16L 1/11 324/326 |
| 2008/0315879 | A1 * | 12/2008 | Saha ....................... A61B 5/055 324/318 |
| 2010/0060285 | A1 * | 3/2010 | Pearson ................. G01V 3/081 324/326 |
| 2013/0106615 | A1 | 5/2013 | Prammer |
| 2013/0118810 | A1 * | 5/2013 | Mercer ................... E21B 7/046 175/45 |
| 2013/0175092 | A1 | 7/2013 | Kolpack |
| 2014/0144704 | A1 | 5/2014 | Cole et al. |
| 2014/0266771 | A1 | 9/2014 | Chau et al. |
| 2015/0369953 | A1 * | 12/2015 | Bailey ....................... G01V 3/38 324/326 |

FOREIGN PATENT DOCUMENTS

| | | |
|---|---|---|
| JP | 2003-078500 | 3/2003 |
| WO | WO 2013/062949 | 5/2013 |
| WO | WO 2013/103875 | 7/2013 |

OTHER PUBLICATIONS

The International Search Report and the Written Opinion of the International Searching Authority for International Application No. PCT/US2015/048692 which is associated with U.S. Appl. No. 14/845,231, dated Dec. 10, 2015, Moscow, Russia.
Digital Control Incorporated, DigiTrak Mark III Directional Drilling Locating System Operator's Manual, May 2008, Kent, Washington.
The First Office Action of the State Intellectual Property Office of People's Republic of China for Chinese Application No. 201510696502.7 which is associated with U.S. Appl. No. 12/497,990, dated May 17, 2017. (Machine translation included).
*The First Office Action of the State Intellectual Property Office of People's Republic of China* for Chinese Application No. 201010142007.9 which is associated with U.S. Appl. No. 12/497,990, dated Oct. 26, 2012. (English translation included).
*The Second Office Action of the State Intellectual Property Office of People's Republic of China* for Chinese Application No. 201010142007.9 which is associated with U.S. Appl. No. 12/497,990, dated Sep. 6, 2013. (English translation).
English and Google machine translations of the previously cited reference: *The First Office Action of the State Intellectual Property Office of People's Republic of China* for Chinese Application No. 2015106965027 which is associated with U.S. Appl. No. 12/497,990, dated May 17, 2017.
File History of U.S. Appl. No. 15/685,790, filed Aug. 21, 2018.
File History of U.S. Appl. No. 15/676,057, filed Aug. 21, 2018.
The Second Office Action of the State Intellectual Property Office of People's Republic of China for Chinese Application No. 201510696502.7 which is associated with U.S. Appl. No. 12/497,990, dated Jan. 19, 2018. (English translation included).
Shen Wei et al., "Design of HF Radar System with Noise Spectrum Monitoring", Systems Engineering and Electronics, vol. 29, No. 10, pp. 1635-1637, Oct. 2007. (English translation included).
The First Office Action of the State Intellectual Property Office of People's Republic of China for Chinese Application No. 201580046941.1 which is associated with International Application No. PCT/US2015/048692 which is associated with U.S. Appl. No. 14/845,231, dated Jan. 3, 2018. (Machine translation included).
The Second Office Action of the State Intellectual Property Office of People's Republic of China for Chinese Application No. 201580046941.1 which is associated with International Application No. PCT/US2015/048692 which is associated with U.S. Appl. No. 14/845,231, dated Mar. 19, 2018. (Machine translation included).
Extended European Search Report for European Application No. 15838319.0 which is associated with International Application No. PCT/US2015/048692 which is associated with U.S. Appl. No. 14/845,231, dated Mar. 16, 2018, Munich, Germany.
The Third Office Action of the State Intellectual Property Office of People's Republic of China for previously cited: Chinese Application No. 201510696502.7 which is associated with U.S. Appl. No. 12/497,990, dated Jan. 19, 2018. (English Translation Included).
International Preliminary Report on Patentability for International Application No. PCT/US2015/048692 which is associated with U.S. Appl. No. 14/845,231, dated Dec. 7, 2016, Moscow, Russia.
Office Action for U.S. Appl. No. 15/676,057 dated Apr. 12, 2019.
Updated Prosecution History of U.S. Appl. No. 15/685,790, as of Apr. 17, 2019.
Office Action for U.S. Appl. No. 15/685,790, dated Feb. 13, 2019.
The Fourth Office Action of the State Intellectual Property Office of People's Republic of China for previously cited: Chinese Application No. 201510696502.7 which is associated with U.S. Appl. No. 12/497,990, dated May 13, 2019 (English Translation Included).
Wanshun Wang, et al, Research and Information System of High-Resolution Underground Pipeline Detection Technology, Aug. 2005.

* cited by examiner

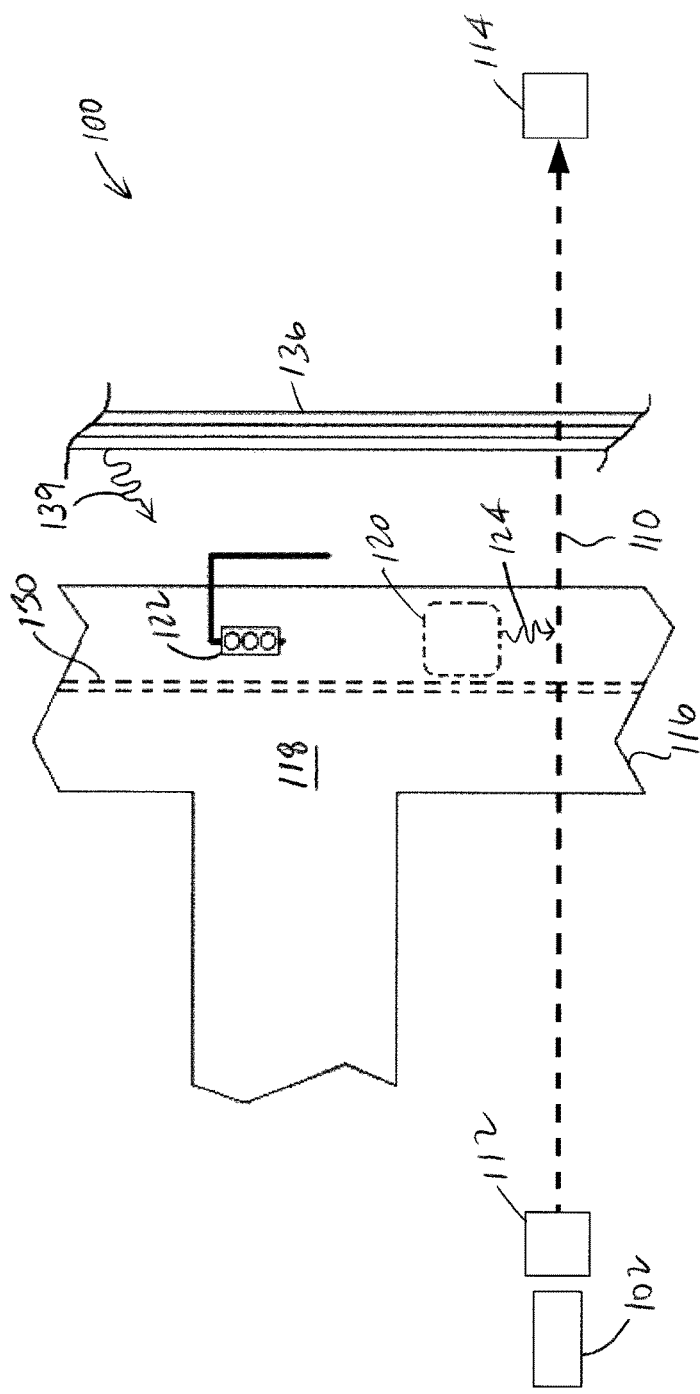
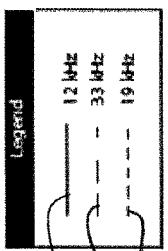
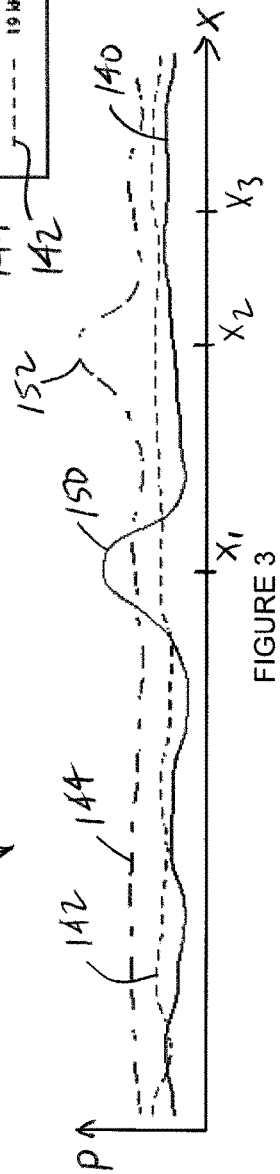
FIGURE 2
FIGURE 3

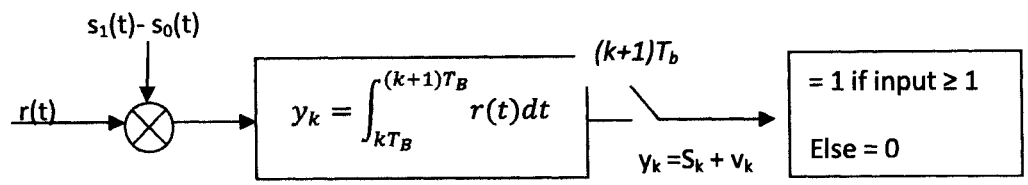
Figure 19a
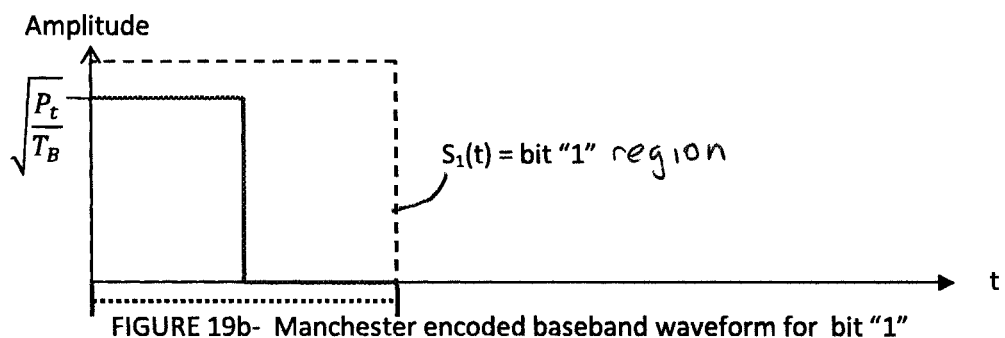
FIGURE 19b- Manchester encoded baseband waveform for bit "1"
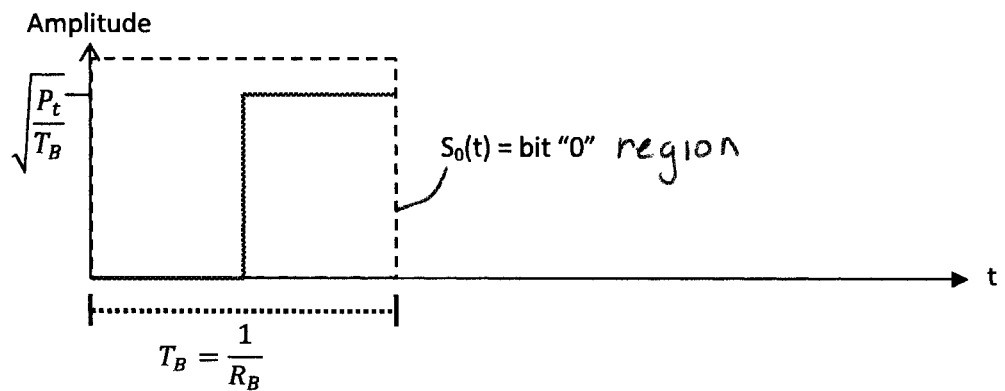
FIGURE 19c- Manchester encoded baseband waveform for bit "0"

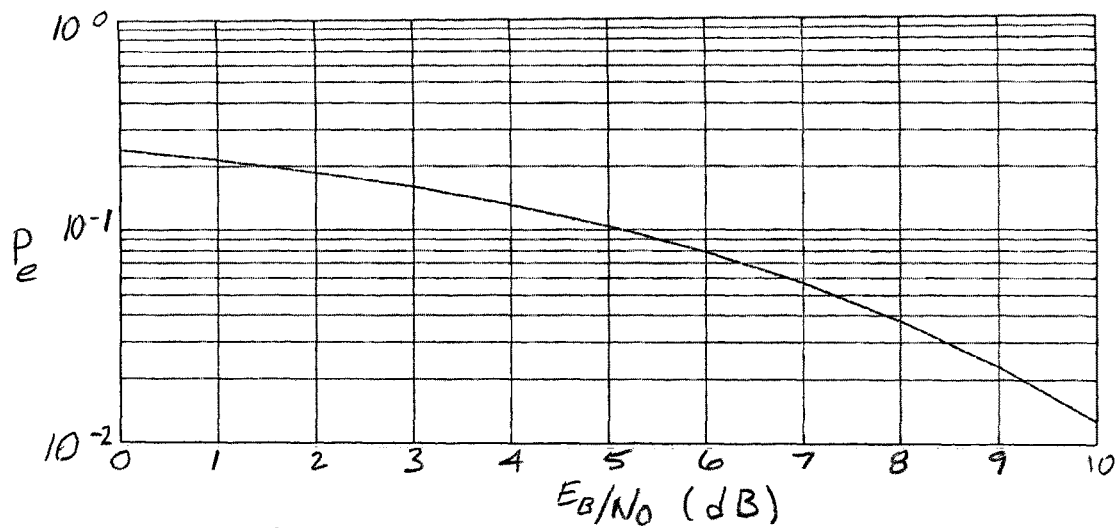
FIGURE 19d- BER of perfectly demodulated Manchester encoded OOSK
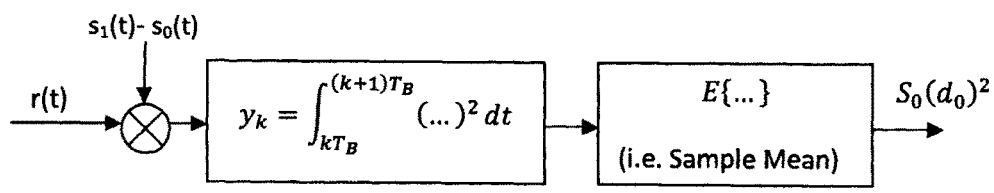
Figure 19e- Estimation of $S_0(d_0)^2$ for receiver's position at a distance $d_o$ from the transmitter
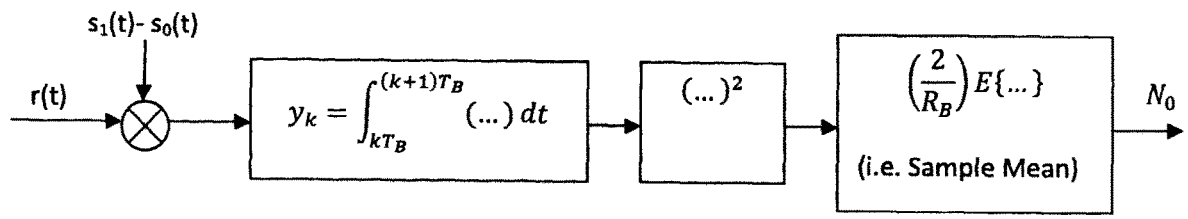
Figure 19f- Estimation of $N_0$ with the transmitter turned off

PREDICTED MAX DEPTH FOR RELIABLE DATA DECODE

| TRANSMITTER FREQ (KHz) | DEPTH (FEET) |
|---|---|
| 12 | 41 |
| 19 | 20 |
| 33 | 11 |

RESUME

FIGURE 20

CURRENTLY SELECTED TRANSMITTER FREQS

12 KHz, 19 KHz, 33 KHz

CONTINUE WITH THESE FREQS

MODIFY FREQUENCY LIST

QUIT

FIGURE 22

APPARATUS FOR PREDICTING A MAXIMUM OPERATIONAL DEPTH FOR AN UNDERGROUND DRILLING PROCEDURE AND METHOD

RELATED APPLICATION

This application is a divisional application of copending U.S. patent application Ser. No. 12/497,990 filed Jul. 6, 2009, the disclosure of which is incorporated herein by reference.

BACKGROUND OF THE INVENTION

The present invention is generally related to locating and/or characterizing the source of an inground transmission frequency and, more particularly, to an apparatus and method for measurement of noise that may interfere with reception of signals received at the inground transmission frequency.

In certain operations in which a transmitter is moved through the ground, substantially continuous location and orientation monitoring of the transmitter is necessary. One example of such an operation resides in the use of the transmitter being carried by an underground boring tool. Another example of such an operation resides in moving the transmitter through a pre-existing borehole or path within the ground. Operations that may use such a pre-existing path include, by way of example, the pullback of a utility line through a previously formed bore hole and mapping of various types of utility lines including water supply and waste lines. Conventional locating and monitoring systems used in conjunction with the foregoing operations are often based on well-established technology involving the detection of an oscillating magnetic field emitted by the transmitter that is moved through the ground.

One concern with respect to prior art systems relates to local interference with the transmitter signal caused by electromagnetic noise that is present in the environment. The transmitter signal is often limited to a low frequency range of less than 50 kilohertz in order for the signal to effectively penetrate the ground and be detectable by a receiver located above the surface. Several sources of noise may be present in the normal operating conditions of systems that employ a transmitter that is moved in the ground while transmitting at these frequencies. For example, underground traffic loop systems, which automatically operate stoplights according to the presence of automobiles at street intersections, can emit signals in the same low frequency range as that used for conventional locator/monitor signals. Another significant source of noise is found in the form of overhead or buried power transmission lines generally emanating noise at 50 Hz or 60 Hz (and harmonics thereof). Also, if two or more underground transmitters are operating near one another, the emitted transmitter signals may mutually interfere, thus reducing the accuracy and efficacy of all of the systems involved. Such noise sources, of which the interfering signal frequencies are known, can be referred to as urban specific noise sources. Other sources of low frequency noise may exist in the environment, such as those generated by computer network connections and community access television (CATV) lines, and these can be referred to as urban general noise sources.

Urban specific noise and urban general noise sources can limit the accuracy and the range over which an underground transmitter may be employed. For instance, the use of the underground transmitter can be restricted under streets with traffic loops. It is recognized by Applicants, however, that the limitations on accuracy and range can be frequency dependent. That is, accuracy and range at one frequency can be more limited than what is seen at a different frequency in a particular noise environment.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Generally, a device and associated method are described for use in conjunction with a system in which a transmitter is moved through the ground in a region during an operational procedure while transmitting a transmitter signal having a transmission frequency. The transmission frequency is selectable as one of a group of discrete transmission frequencies that are spaced apart in a transmission frequency range and the region includes electromagnetic noise that can vary within the region and across the transmission frequency range.

In one aspect of the disclosure, the portable device can include a receiver having a receiver bandwidth that at least includes the transmission frequency range for measuring the electromagnetic noise at least in the transmission frequency range to establish a frequency content of the electromagnetic noise for use in selecting one of the discrete transmission frequencies as a selected transmission frequency that is subsequently received by the receiver during the operational procedure.

In another aspect of the disclosure, a portable device can include a receiver having a receiver bandwidth that at least includes the transmission frequency range and the receiver is configured for operation in (i) a setup mode for measuring the electromagnetic noise at least in the transmission frequency range to establish a frequency content of the electromagnetic noise for use in selecting one of the discrete transmission frequencies as a selected transmission frequency that is subsequently transmitted by the transmitter during the operational procedure and (ii) in a locating mode for receiving the selected transmission frequency to provide certain information relating to the transmitter.

In still another aspect of the disclosure, a method is described in which, prior to the operational procedure, the electromagnetic noise in the region is detected to generate a set of noise environment information. The set of noise environment information is analyzed to establish a frequency content of the electromagnetic noise for use in selecting the transmission frequency as one of the plurality of discrete transmission frequencies.

In a further aspect of the disclosure, a portable device and associated method are described for use in conjunction with a system in which an electromagnetic locating signal is transmitted from within the ground in a region during an operational procedure. The locating signal includes a transmission frequency that is selectable from a group of discrete transmission frequencies that are spaced apart in a transmission frequency range and the region includes electromagnetic noise that can vary within the region and across the transmission frequency range. The portable device includes a receiver having a receiver bandwidth that at least includes the transmission frequency range and is operable for measuring the electromagnetic noise at least in the transmission frequency range to establish a frequency content of the electromagnetic noise for use in selecting one of the discrete transmission frequencies as a selected transmission frequency that is subsequently utilized as the locating signal during the operational procedure.

In a continuing aspect of the disclosure, a portable device is described for use in conjunction with a system in which an electromagnetic locating signal is transmitted from within the ground in a region during an operational procedure. The locating signal includes a transmission frequency that is selectable from a group of discrete transmission frequencies that are spaced apart in a transmission frequency range and the region includes electromagnetic noise that can vary within the region and across the transmission frequency range. The portable device includes a receiver having a receiver bandwidth that at least includes the transmission frequency range and is configured for operation in (i) a setup mode for measuring the electromagnetic noise at least in the transmission frequency range to establish a frequency content of the electromagnetic noise for use in selecting one of the discrete transmission frequencies as a selected transmission frequency that is subsequently utilized as the electromagnetic locating signal during the operational procedure and (ii) in a locating mode for receiving the selected transmission frequency to provide certain information relating to the electromagnetic locating signal.

In another aspect of the disclosure an apparatus and associated method are described for use in conjunction with a system in which a transmitter is moved through the ground in a region during an operational procedure while transmitting a transmitter signal and the region includes electromagnetic noise that can vary in frequency and based on location within the region. Prior to the operational procedure, at least the electromagnetic noise in the region is detected at an above ground location by a detector. A predicted maximum operational depth of the transmitter for reception of the transmitter signal at the above ground location is determined by a processor based, at least in part, on the detected electromagnetic noise. The predicted maximum operational depth is displayed at least prior to the operational procedure.

In addition to the exemplary aspects and embodiments described above, further aspects and embodiments will become apparent by reference to the drawings and by study of the following descriptions.

BRIEF DESCRIPTIONS OF THE DRAWINGS

Exemplary embodiments are illustrated in referenced figures of the drawings. It is intended that the embodiments and figures disclosed herein are to be illustrative rather than limiting.

FIG. 2 is a diagrammatic plan view of a region in which an operational procedure is to be performed and in which the device of FIG. 1 can be used preparatory to the operational procedure.

FIG. 3 is a graph of noise power versus frequency including plots of noise power for three distinct frequencies in the region of FIG. 2 and in vertical alignment with various noise producing features that are shown in FIG. 2.

Figure 1:
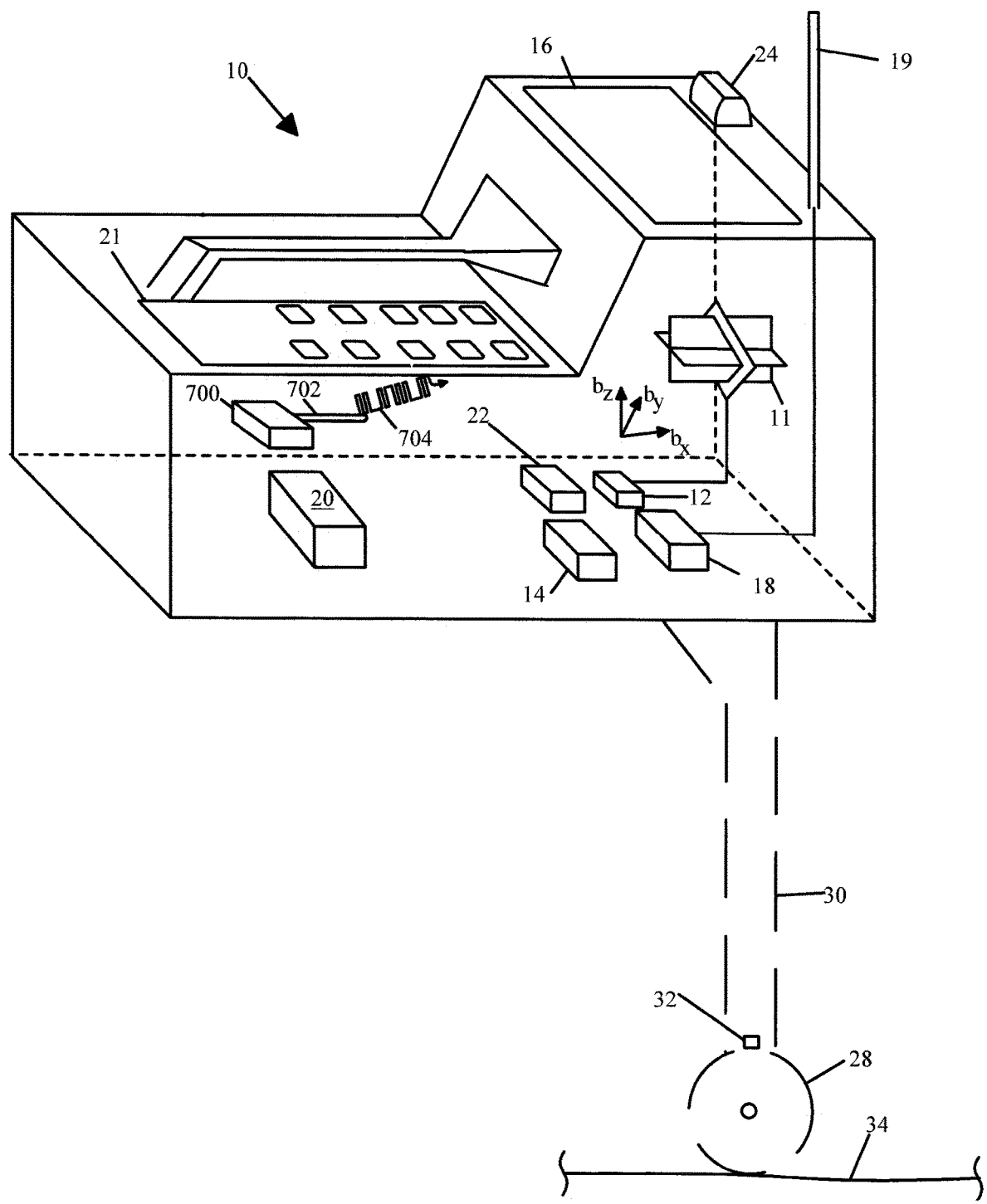
FIG. 1 is a diagrammatic view of one embodiment of a portable device that is produced according to the present disclosure, shown here to illustrate its components.
Figure 4:
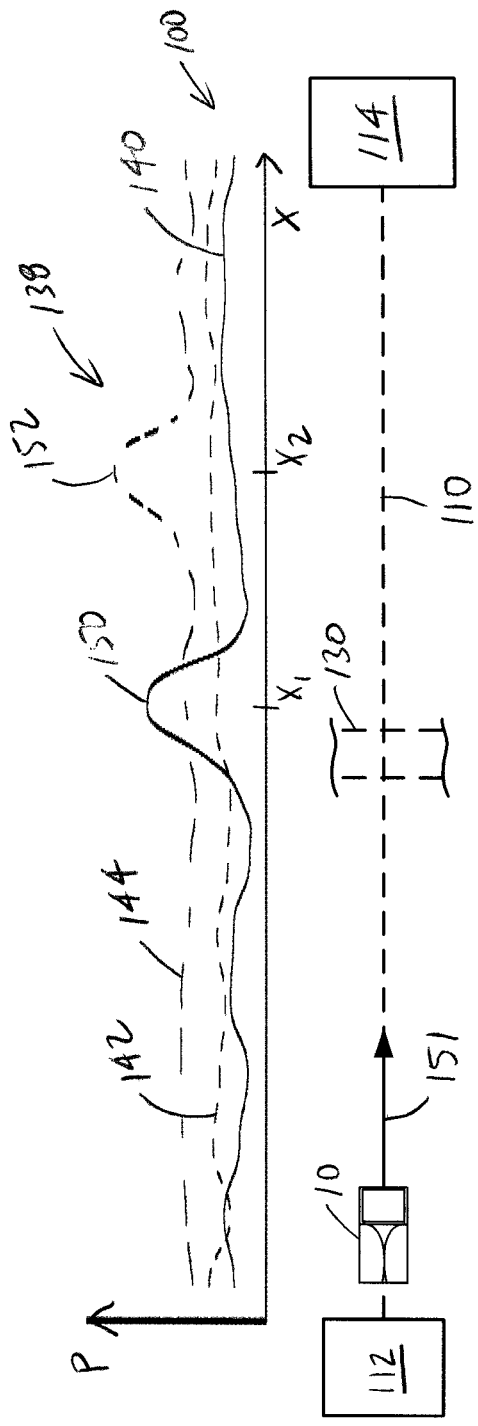

FIG. 4 is a further simplified diagrammatic illustration of a portion of the region of FIG. 2 in a plan view including the intended path with the portable device of FIG. 1 arranged thereabove. The intended path extends between a start point or pit and a stop point or pit. The graph of FIG. 3 is shown in alignment with the intended path and in relation to an inground obstacle.

Figure 5:
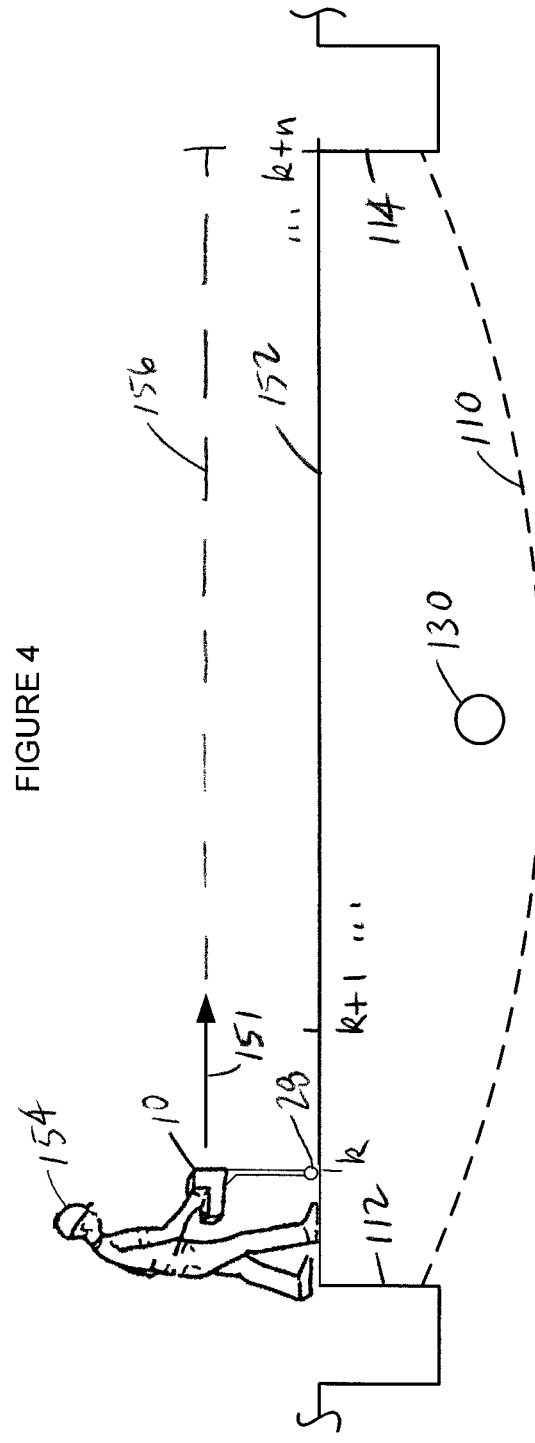

FIG. 5 is a simplified diagrammatic view, in elevation, of the region of FIG. 4 in which an operator moves the portable device of FIG. 1 along a measurement path.

Figure 6:
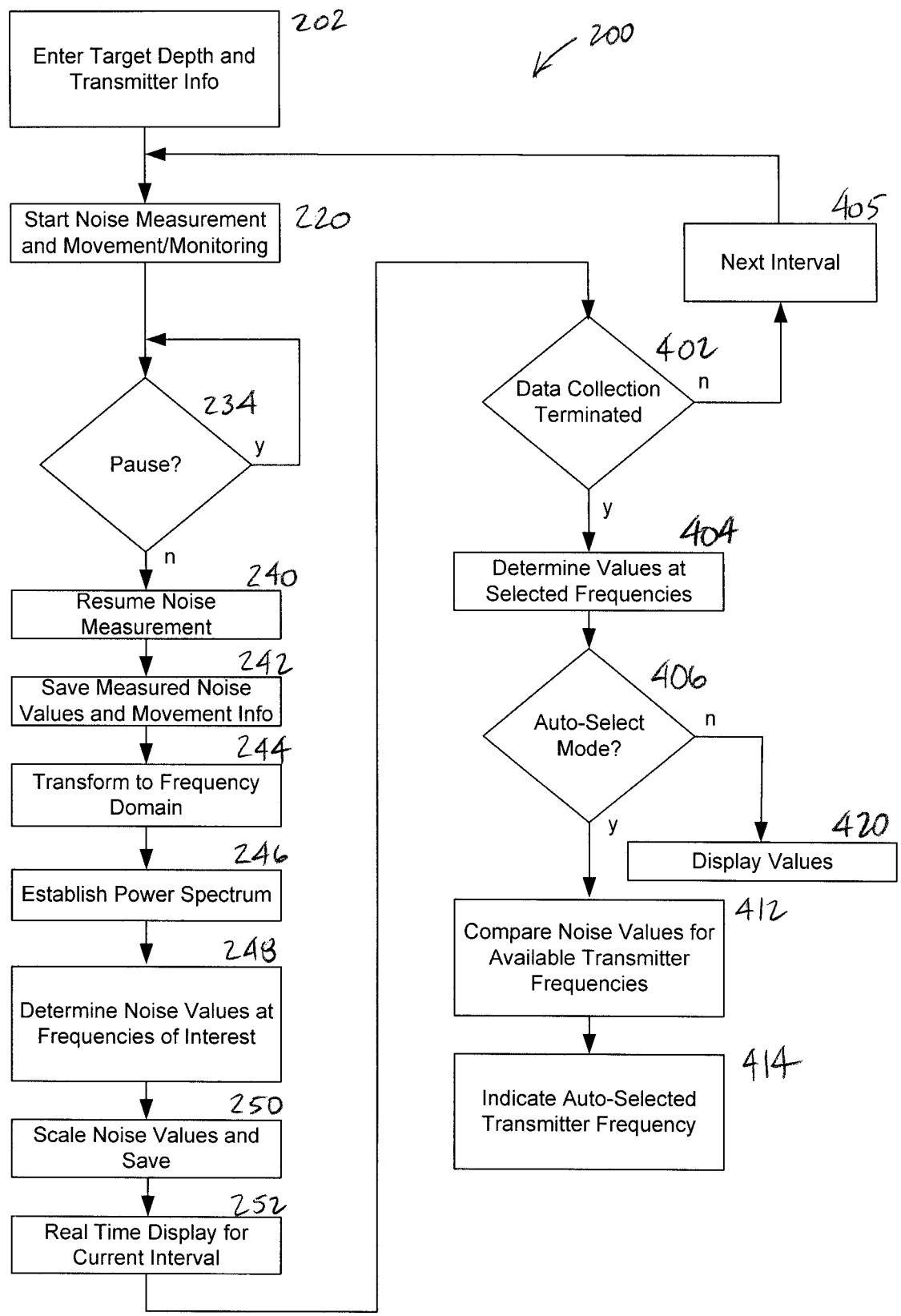

FIG. 6 is a flow diagram that illustrates one embodiment for the operation of the device of FIG. 1 in a noise measurement mode.

Figure 7:
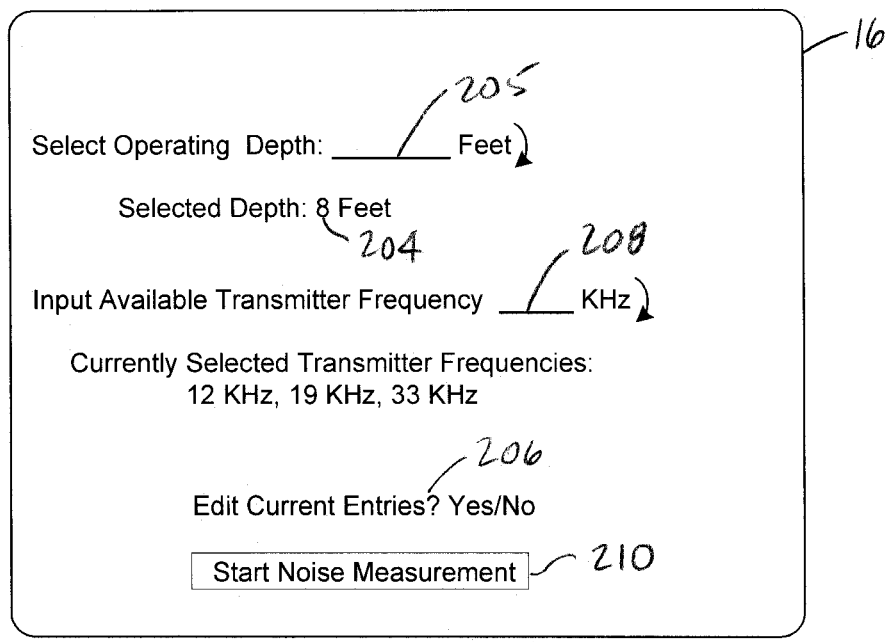

FIG. 7 is a screen shot which illustrates one possible appearance of the display screen of the device of FIG. 1 during setup for the noise measurement.

Figure 8:
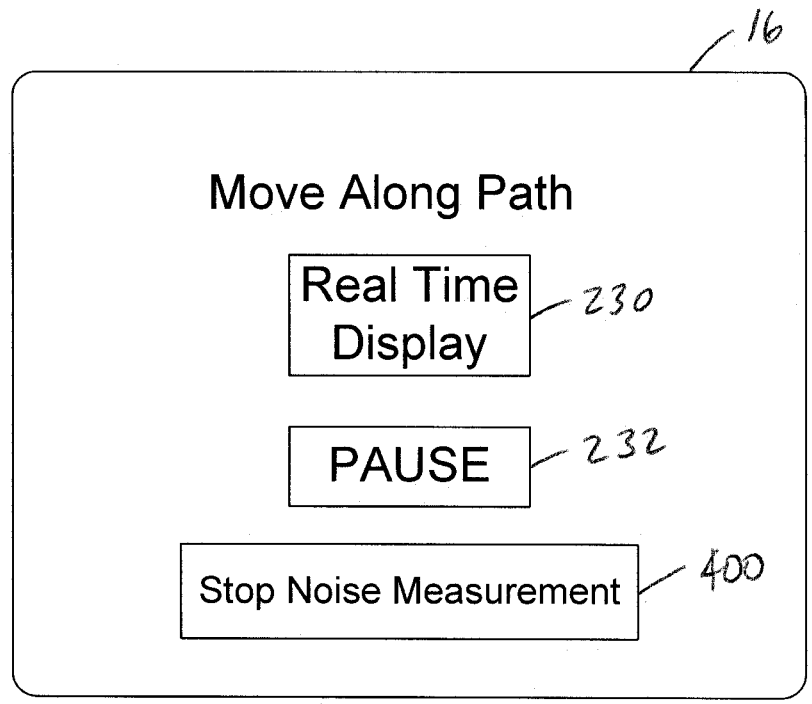

FIG. 8 is another screen shot which illustrates one possible appearance of the display screen of the device of FIG. 1 during the noise measurement in which the operator can be instructed to move along the measurement path and can be given various options to control and monitor the noise measurements.

Figure 9:
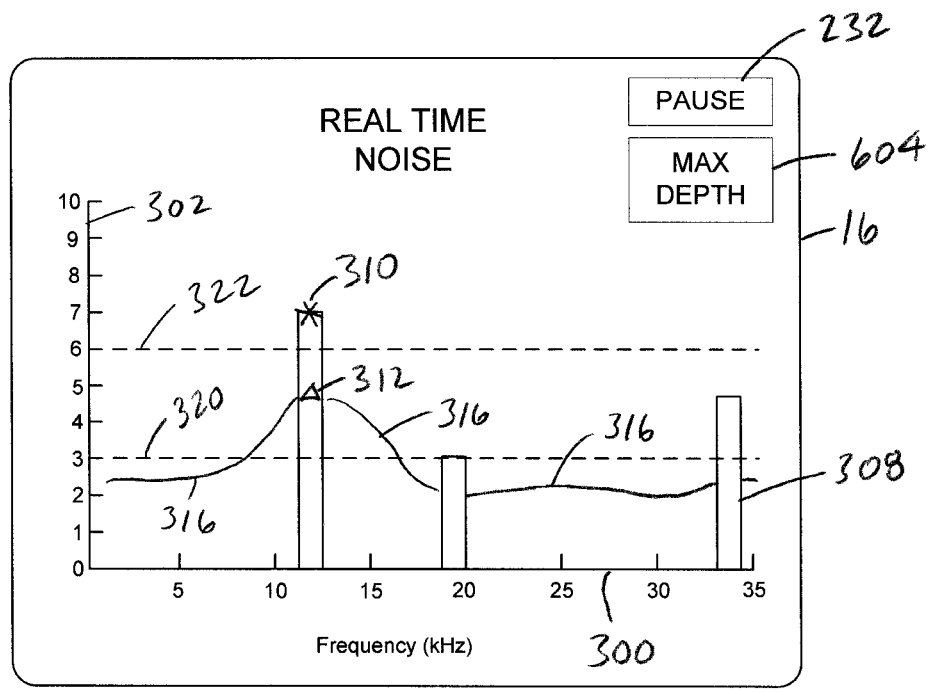
Figure 10:
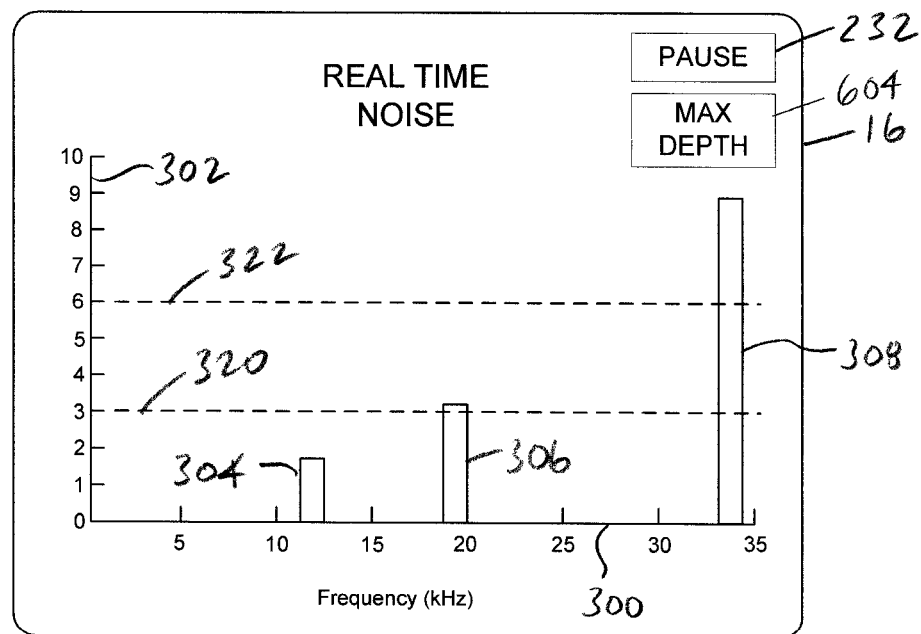
Figure 11:
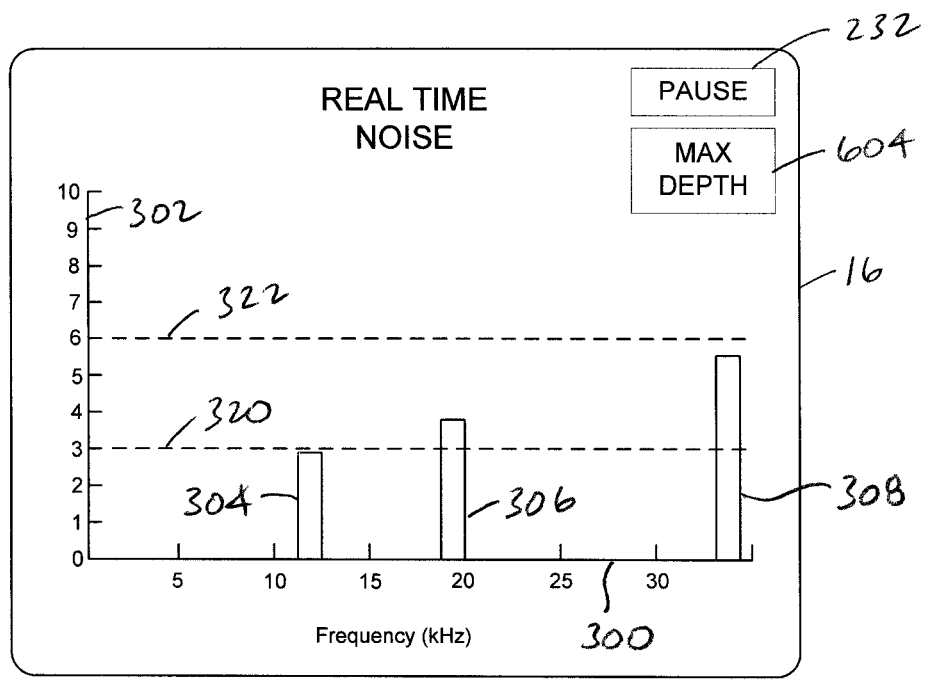

FIGS. 9-11 are screen shots which illustrate the possible appearances of the display screen of the device of FIG. 1 at three respective positions along the measurement path during the noise measurement and where each figure illustrates the noise in real time for a respective one of the positions.

Figure 12:
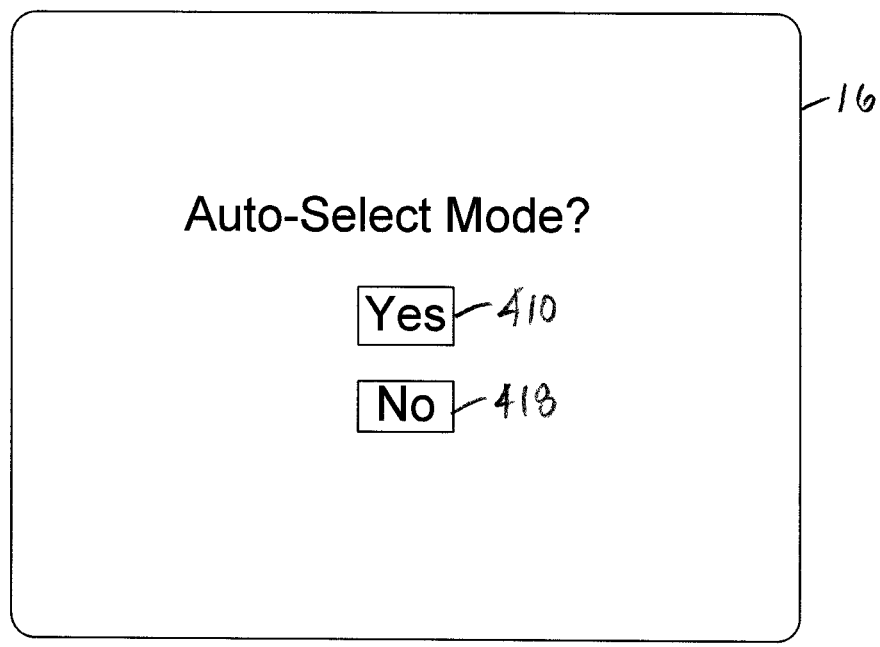

FIG. 12 is another screen shot which illustrates one possible appearance of the display screen of the device of FIG. 1 subsequent to the noise measurement in which the operator can cause the device to enter an Auto-Select Mode.

Figure 13:
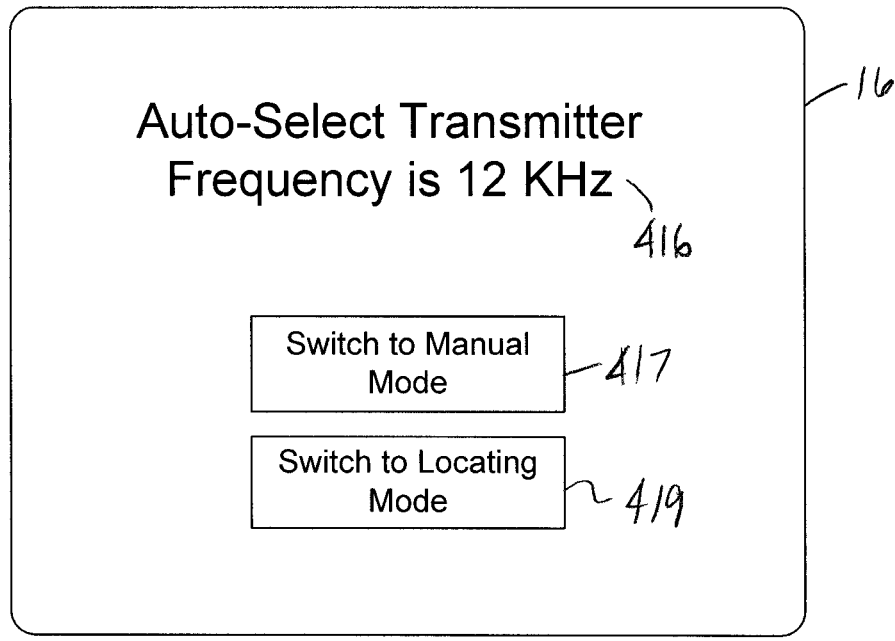

FIG. 13 is another screen shot which illustrates one possible appearance of the display screen of the device of FIG. 1 that designates an automatically identified transmission frequency for subsequent use and in which additional options are provided to the operator.

Figure 14:
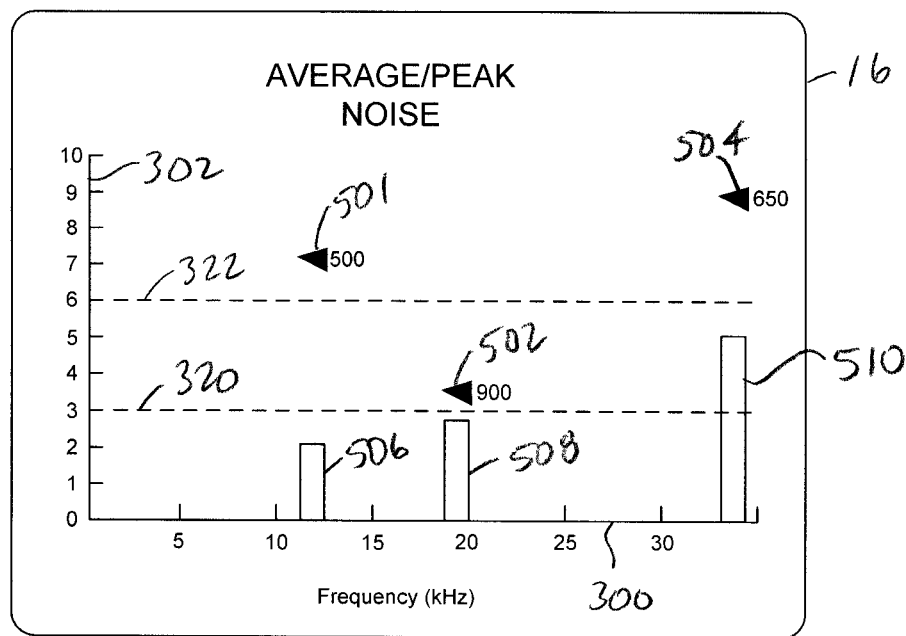

FIG. 14 is another screen shot which illustrates one possible appearance of the display screen of the device of FIG. 1 which shows noise values that have been determined for a number of selected frequencies that have been monitored along the measurement path.

Figure 15:
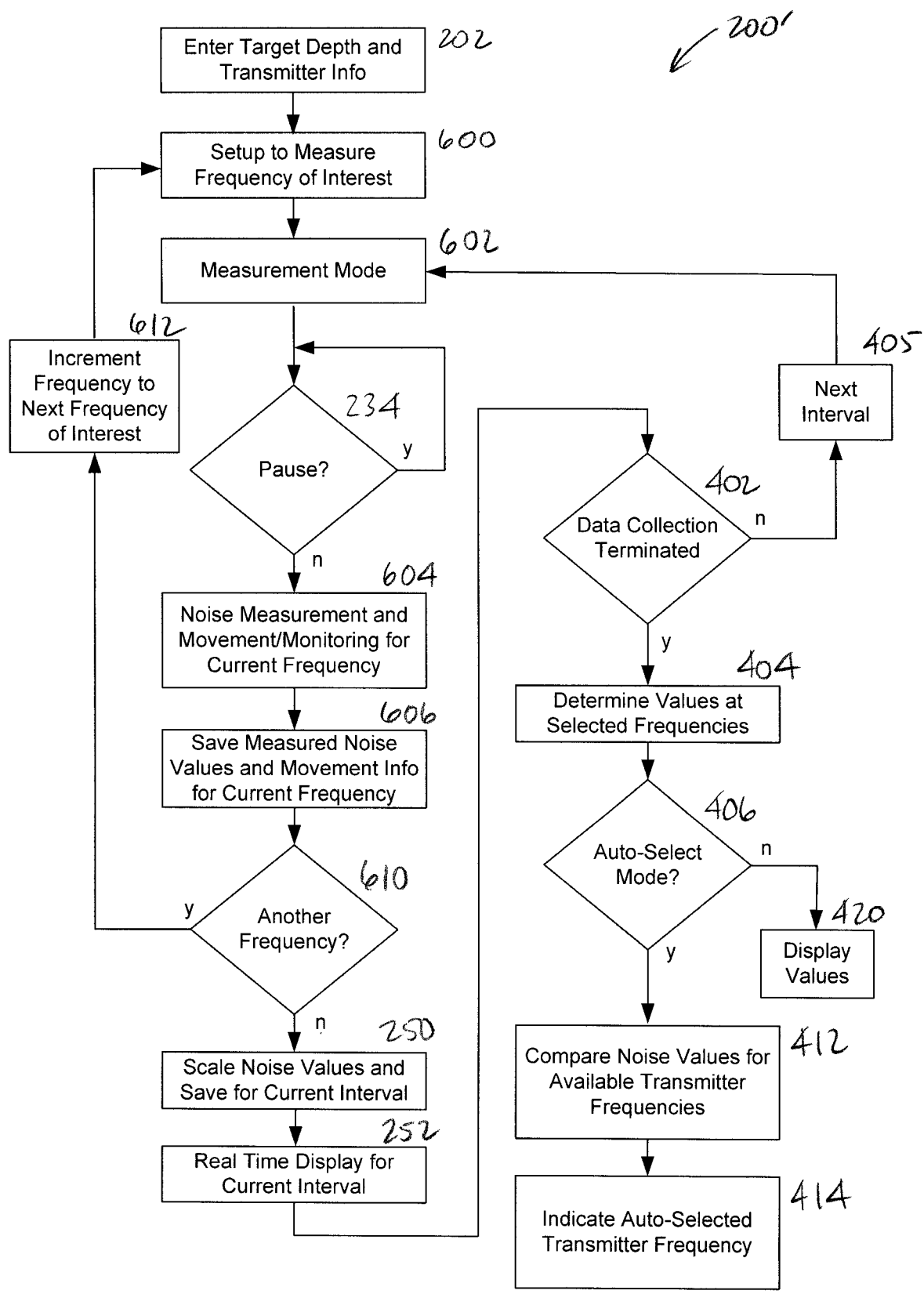

FIG. 15 is a flow diagram that illustrates another embodiment for the operation of the device of FIG. 1 in the noise measurement mode.

Figure 16:
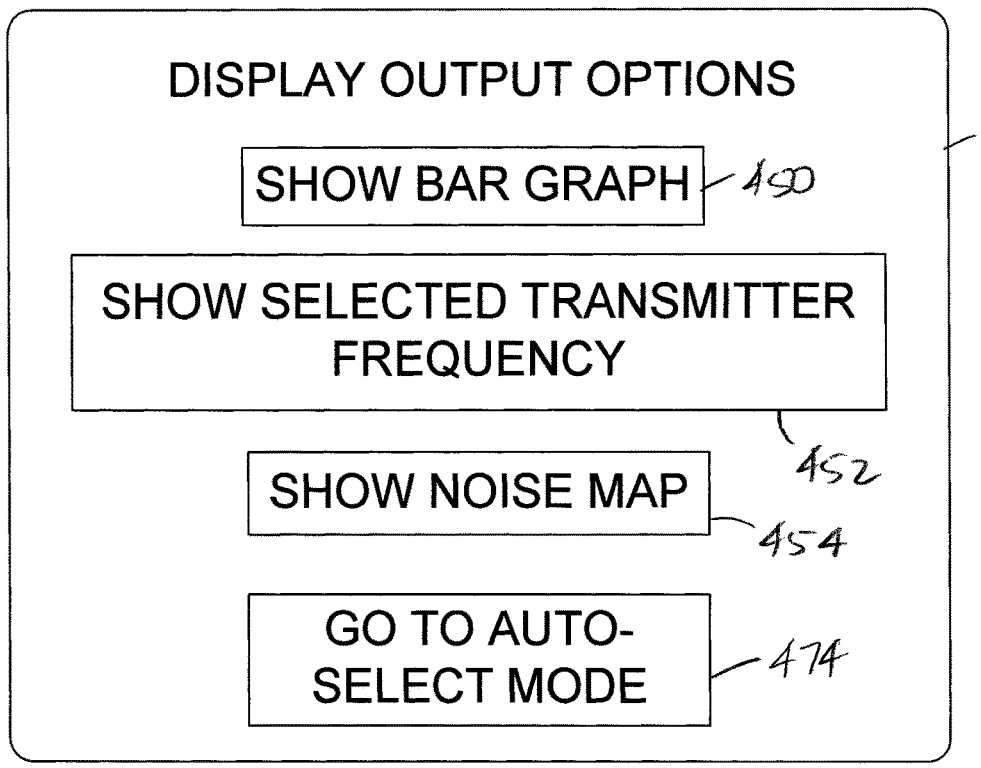

FIG. 16 is a screen shot which illustrates one possible appearance of the display screen of the device of FIG. 1 which shows display output options that may be presented to a user.

Figure 17:
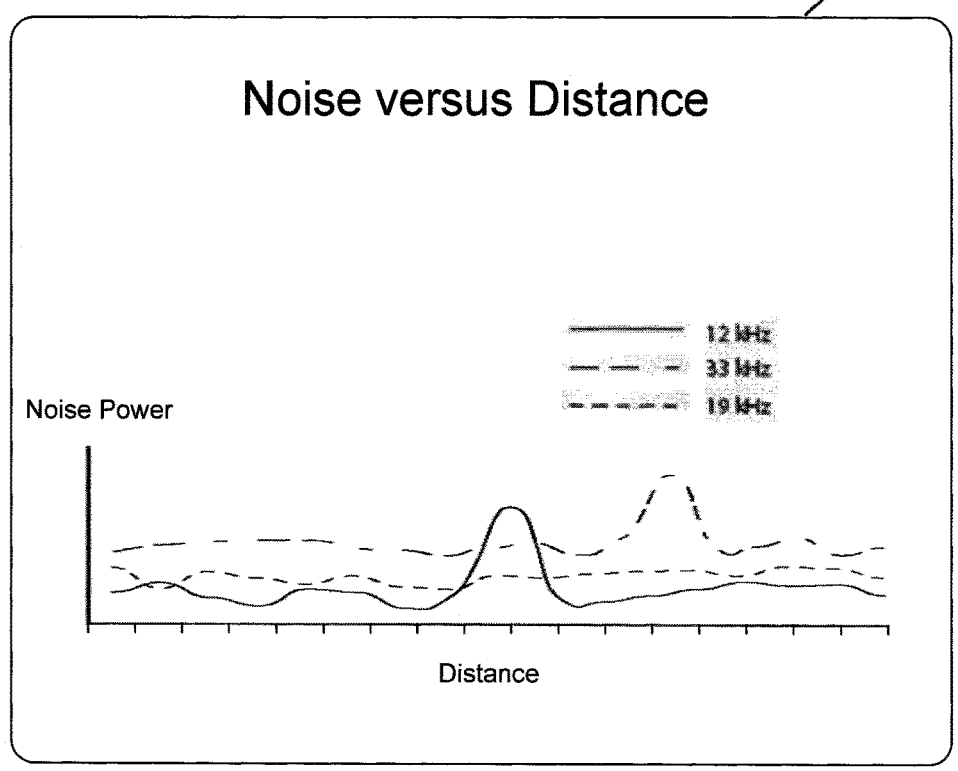

FIG. 17 is a screen shot which illustrates one possible appearance of the display screen of the device of FIG. 1 responsive to a selection by the user for the display of measured noise along the intended path at one or more selected frequencies.

Figure 18:
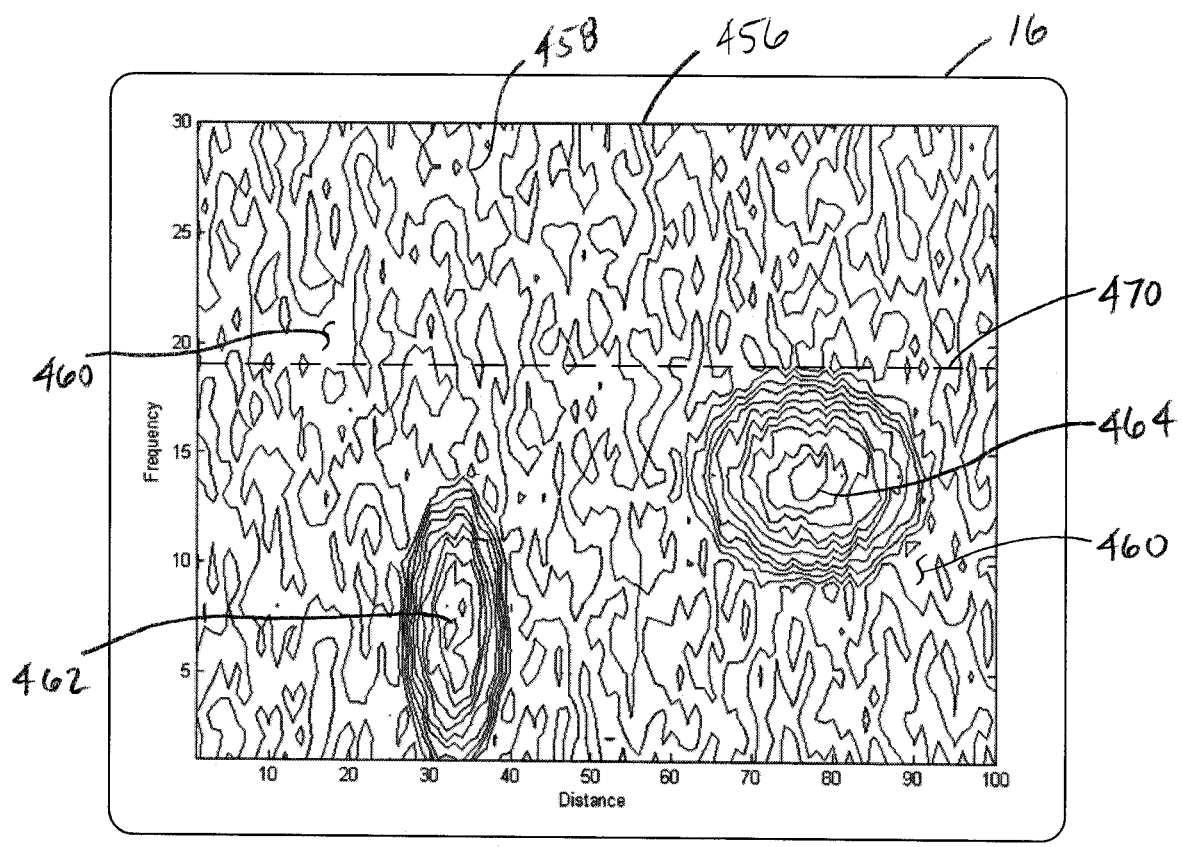

FIG. 18 is a screen shot which illustrates one possible appearance of the display screen of the device of FIG. 1 responsive to a selection by the user for the display of a noise map of the operation region.

FIG. 19$a$ is a process diagram which illustrates baseband decoding for a coherent receiver with coherent demodulation.

FIGS. 19$b$ and 19$c$ are waveform diagrams which illustrate plots of Manchester encoded bit 1 and bit 0, respectively, each of which occurs in a bit region having a length that corresponds to the time period of one bit.

FIG. 19$d$ is a logarithmic plot showing the value of bit error rate, designated as $P_e$, plotted against signal to noise ratio, designated as $E_B/N_o$.

FIG. 19e is process diagram that graphically illustrates the determination of signal strength at a distance $d_0$ between a transmitter and receiver.

FIG. 19f is a process diagram that graphically illustrates the determination of a noise value $N_0$.

Figure 19G:
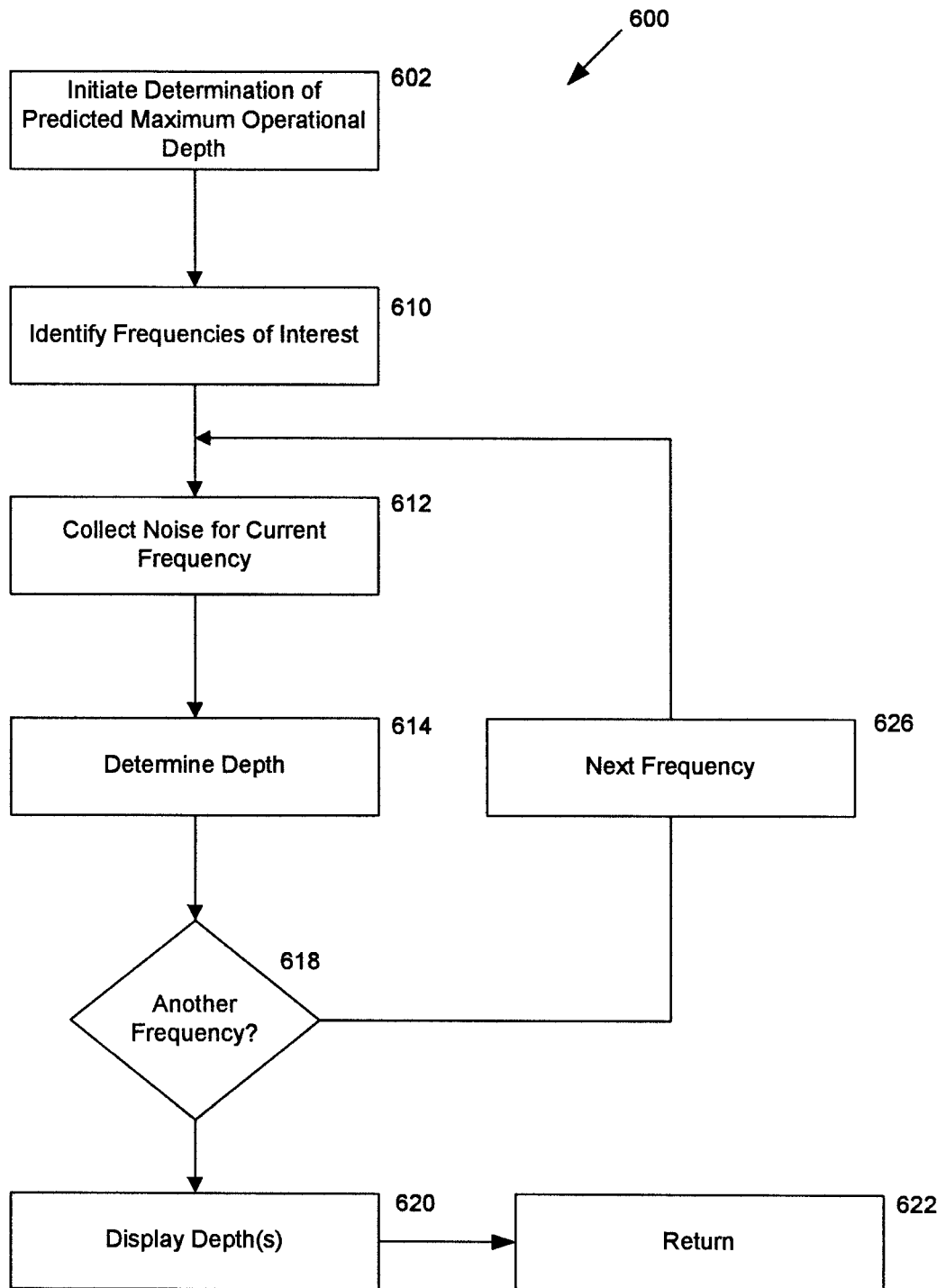

FIG. 19g is a flow diagram which illustrates one embodiment of a technique for determining maximum usable transmitter depth at points along a borepath or other suitable path in light of detected noise.

FIG. 20 is a screen shot which illustrates one possible appearance of the display screen of the device of FIG. 1 responsive to a selection by the user for the display of maximum usable transmitter depth(s) within the operating region.

Figure 21:
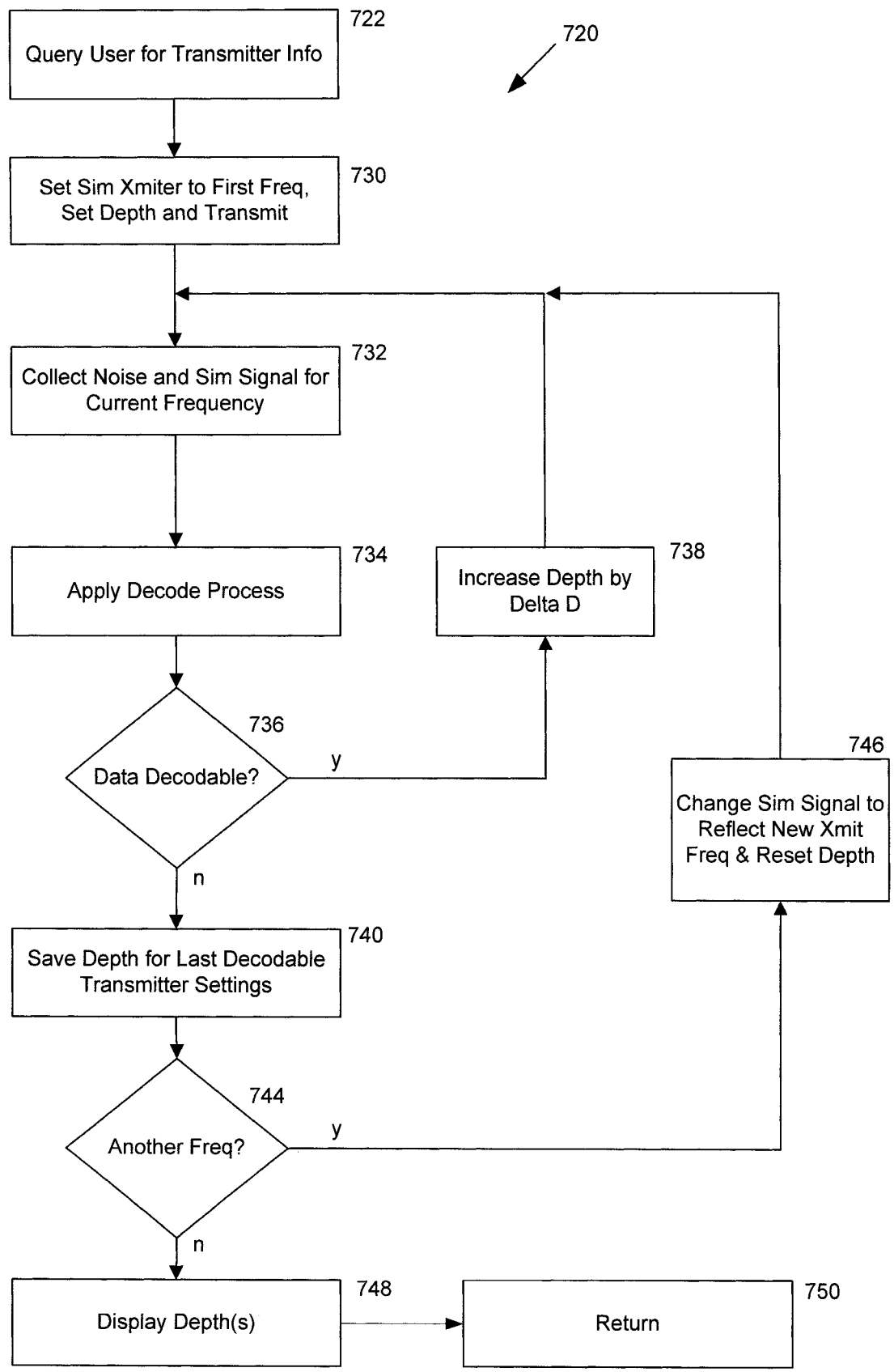

FIG. 21 is a flow diagram of another embodiment of a method for predicting maximum usable operational depth for reliable data decoding.

FIG. 22 is a screen shot which illustrates one embodiment of the appearance of the display which provides for confirmation and user selection of transmitter frequencies that are of interest.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology such as, for example, upper/lower, right/left and the like may be adopted for purposes of enhancing the reader's understanding, with respect to the various views provided in the figures, and is in no way intended as being limiting.

Turning now to the drawings, wherein like items may be indicated by like reference numbers throughout the various figures, attention is immediately directed to FIG. 1, which illustrates one embodiment of a portable device, generally indicated by the reference number 10. It is noted that inter-component cabling has not been illustrated in order to maintain illustrative clarity, but is understood to be present and may readily be implemented by one having ordinary skill in the art in view of this overall disclosure. Device 10 includes a three-axis antenna cluster 11 measuring three orthogonally arranged components of magnetic flux indicated as $b_x$, $b_y$, and $b_z$. One useful antenna cluster contemplated for use herein is disclosed by U.S. Pat. No. 6,005,532 entitled ORTHOGONAL ANTENNA ARRANGEMENT AND METHOD which is commonly owned with the present application and is incorporated herein by reference. Antenna cluster 11 is electrically connected to a receiver section 12 which can include amplification and filtering circuitry, as needed. With regard to the latter, a data detection filter can be provided as part of the receiver section. The electrical connection to the receiver section has not been shown, but is understood to be present. A tilt sensor arrangement 14 may be provided for measuring gravitational angles from which the components of flux in a level coordinate system may be determined. Device 10 further includes a graphics display 16, a receiver section 17, a telemetry arrangement 18 having an antenna 19 and a processing section 20 interconnected appropriately with the various components. The processing section can include a digital signal processor (DSP) that is configured to execute various procedures that are needed during operation. It should be appreciated that graphics display 16 can be a touchscreen in order to facilitate operator selection of various buttons that are defined on the screen and/or scrolling can be facilitated between various buttons that are defined on the screen to provide for operator selection. Such a touch screen can be used alone or in combination with an input device 21 such as, for example, a keypad. The latter can be used without the need for a touch screen. Moreover, many variations of the input device may be employed and can use scroll wheels and other suitable well-known forms of selection device. The telemetry arrangement and associated antenna are optional. The processing section can include components such as, for example, one or more processors, memory of any appropriate type and analog to digital converters. As is well known in the art, the latter should be capable of detecting a frequency that is at least twice the frequency of the highest frequency of interest. As one option, a GPS (Global Positioning System) receiver 22 may be included along with a GPS antenna 24. The GPS components may be survey grade in order to provide enhanced position determination accuracy. In one embodiment where a GPS receiver is not used, some other form of measurement device may be employed. As one example, shown in phantom, a measuring wheel 28 can be supported on a leg 30 that can be removably attachable with device 10. A sensor 32 is positioned on leg 30 for monitoring rotation of measuring wheel 28 as it is rolled along a surface 34 of the ground. The sensor may be of any suitable type such as, for example, optoelectronic, mechanical or Hall effect with measuring wheel 28 configured appropriately to cooperate with the selected type of sensor. Sensor 32 generates a signal that is monitored by processing section 20 in order to characterize movement of the device for purposes which will become apparent below. Other components (not shown) may be added as desired such as, for example, a magnetometer to aid in position determination relative to the drill direction and ultrasonic transducers for measuring the height of the device above the surface of the ground. In the present example, device 10 is configured for serving as a locator for purposes of monitoring and tracking a transmitter that moves through the ground as described in U.S. Pat. No. 6,496,008 (hereinafter the '008 patent) which is commonly owned with the present application and incorporated herein by reference in its entirety. The '008 patent provides further details with respect to the components of device 10 and its operation for purposes of tracking and monitoring a transmitter in the ground. In the example of the '008 patent, the transmitter emits a dipole field that is shown in FIGS. 2-4 of the patent. As will be seen, device 10 is further configured for use in selecting the frequency at which the transmitter will subsequently operate in the ground prior to actually performing a particular operational procedure. Such operational procedures include, but are not limited to a horizontal directional drilling operation to form a borehole, a pullback operation that might be performed subsequent to a drilling operation and a survey operation for mapping a preexisting pathway in the ground. Another type of operational procedure that is relevant to these discussions is cable locating. In cable locating, an underground cable is caused to emit an electromagnetic field along its length. The locating functionality that can be provided by device 10 during the desired operational procedure serves as one mode of the device which may be referred to as a locating mode.

Irrespective of the particular type of operational procedure that is to be performed, it should be appreciated that transmitters or sondes can be made available at different frequencies, but with essentially interchangeable housing outlines. Often, the boring tool or pullback device that operates in the ground is configured for accepting a transmitter having a given housing outline such that the locating signal could be selected from among a number of available transmitters by simply installing a transmitter of choice. It would be desirable, however, to provide on-site guidance to operators with respect to which available transmitter would best match a particular operational procedure.

Turning to FIG. 2, a region 100 is diagrammatically illustrated in a plan view in which an operational procedure is to be performed. In particular, a drill rig 102 is illustrated for use in performing a horizontal directional drilling procedure to extend a drill string (not shown) along an intended or expected path 110 from a start point 112 which is shown as a first pit to stop point 114 which is shown as a stop pit. It should be appreciated that the presence of the start and stop points is not necessary to perform the procedure to be described using portable device 10 and these pits have been shown for illustrative purposes. The intended path extends beneath a roadway 116 that leads to an intersection 118. A traffic loop 120 is used to control a traffic signal 122 in a known manner such that traffic loop interference 124 is emitted by the traffic loop. A utility line 130 is buried in the intersection and itself intersects intended path 110 in a plan view. An overhead utility power line 136 is positioned proximate to the intersection and emits power line interference 139 which is generally produced at either 50 Hz or 60 Hz, and harmonics thereof, depending upon the physical location of region 100 in the world. It should be appreciated that the measurement of the noise environment should preferably represent the actual noise environment that will be encountered during a subsequent operational procedure such as, for example, during horizontal directional drilling or a pullback operation for purposes of installing a utility. In some cases, such as in a pullback operation, the expected path is a pre-existing borehole. The inground path can be pre-existing for other operational procedures such as, for example, that of mapping an existing utility line.

Referring to FIG. 3, in conjunction with FIG. 2, the former includes a graph 138 of noise power P versus distance along an x axis. Three frequencies are plotted including 12 KHz which is shown as a solid line and indicated by the reference number 140, 19 KHz which is shown as a dashed line and indicated by the reference number 142, and 33 KHz which is shown as a line that is made up of pairs of long dashes that are separated by a short dash and indicated by the reference number 144. It should be appreciated that these three frequencies represent actual frequencies at which a locating signal may be transmitted from an inground transmitter such as one carried by a boring tool; however, the frequencies are not intended as being limiting and have been selected for exemplary purposes. Any suitable transmission frequency may be utilized and considered in accordance with these descriptions. Accordingly, plots in FIG. 3 may be used to represent transmitters that correspond to any available set of transmission frequencies. The plots of FIG. 3 are shown in a generally vertically aligned relationship with region 100 of FIG. 2 in order to illustrate the influence that interference generating components can have at different frequencies. For example, responsive to traffic loop interference 124, plot 140 at 12 KHz, exhibits a peak 150 at a position $x_1$ having a noise power that is greater than the noise power that is exhibited at $x_1$ by plots 142 or 144. It is worthwhile to note that peak 150 is at least generally aligned with utility line 130 of FIG. 2. Outside of peak 150, plot 140 exhibits a noise power that is most often the lowest of the three plots along the x axis. Responsive to overhead power line noise 139, plot 144 exhibits a peak 152 at $x_2$ that extends significantly above the other two plots. Plot 144 further exhibits the highest overall noise value along the x axis except in the region of peak 150 of plot 140. While plot 142, at 19 KHz does not demonstrate the lowest noise for many positions along the x axis, as compared to plot 140, it is notable that plot 142 does not include a pronounced peak as do the other two plots.

Turning to FIG. 4, a simplified diagrammatic illustration of region 100 is presented that shows start point 112 and stop point 114 with intended path 110 extending therebetween in a plan view. A portion of utility 130 is shown where it intersects the intended path in this view. Further, portable device 10 is illustrated, arranged generally at one end of the intended path for movement in a direction 151 at least generally along the intended path at least as the intended path appears as a projection at the surface of the ground.

Referring to FIG. 5, a simplified diagrammatic illustration of region 100 is presented, in an elevational view, that shows start point 112, stop point 114 and intended path 110 extending therebetween. The surface of the ground is indicated by the reference number 152. The intended path is configured to pass below utility 130 so as to avoid a collision or contact with the utility. Portable device 10 is held by an operator 154 and moved in the direction of arrow 151 along a measurement path 156 that extends to stop point 114. It is noted that the measurement path coincides with the intended path in the view of FIG. 4, as a projection on the surface of the ground. In the present example, operator 154 rolls measuring wheel 28 at least generally along a projection of intended path 110 at the surface of the ground. As will be further discussed, measuring wheel 28 and leg 30 are not required. That is, other forms of measurement of the movement of portable device 10 may be used such as, for example, GPS receiver 22 or operator 154 may be instructed to move the portable device at a constant speed in the direction of arrow 151. In another embodiment, an accelerometer arrangement can be used for detecting movement. For example, in devices such as pedometers, the accelerometer generates a pulse in response to the movement resulting from a footstep, and the resulting pulses are counted to provide an indication of distance. Distance of movement can be rendered more precise by combining the accelerometer pulse data with information regarding the length of an individual operator's stride, as is known the art, although such precision is not considered essential. Directional movement can be detected through, for example, the use of magnetic sensors using the Earth's magnetic field, as is known in the art. For purposes of the present example, movement of device 10 is characterized with respect to positions k, k+1 . . . k+n, where the current location of the portable device is position k and position k+n is located at stop point 114.

Turning to FIGS. 6 and 7, the former is a flow diagram which illustrates one embodiment of a method, generally indicated by the reference number 200, for the operation of device 10, while the latter figure illustrates screen 16 of device 10. Initially, at 202 in FIG. 6, device 10 can request information concerning the target depth for the intended path and information concerning the transmitter. In the corresponding screen shot of FIG. 7, operator 154 (FIG. 5)

can enter the selected or target operating depth. Transmitter power may also be entered. In the present example, a depth of 8 feet has been selected at 204 using an input line 205. An edit selection 206 can provide for revising any entries on the screen. An input line 208 provides for the entry of information relating to available transmitter frequencies. In the present example, the operator has entered the values of 12 KHz, 19 KHz and 33 KHz, which correspond to the frequencies shown in FIGS. 3 and 4 for illustrative purposes. Virtually any combination of transmitter frequencies can be entered by the operator. Of course, the current entries can be revised by selecting edit feature 206, for example, by direct selection on the screen or by using input device 21 of FIG. 1. Once the operator has concluded the entry of data, the operator selects a Start Noise Measurement button 210.

In the noise measurement mode, which may be referred to as a setup mode in a multimode device, operation proceeds to 220 in FIG. 6. Depending on the particular embodiment of device 10, the measurement of noise can be accompanied by monitoring of movement of device 10. That is, the noise measurement can be weighted based on movement of device 10. As described above, movement monitoring in the present example is provided by monitoring the rotation of measurement wheel 28 as it is rolled along the surface of the ground or by using GPS 22. With regard to the operation of device 10 according to FIG. 6, it will be seen that noise measurements proceed over a series of intervals. Each interval can be quite short, with the time period of the interval being selected based on the transmitter frequencies that are being monitored. Accordingly, a set of noise environment information is detected for the interval that can be used to establish the noise that is present at particular frequencies and/or across a range of frequencies in a continuous manner.

FIG. 8 illustrates one embodiment of the appearance of screen 16 during the measurement mode that can be displayed in conjunction with ongoing operation according to FIG. 6. This screen instructs the operator to move along the measurement path and provides a number of options that can be in the form of buttons defined on the screen. In one option, the operator can select a Real Time Display button 230 that will cause device 10 to display the current noise measurement for the transmitter frequencies that have been selected by the operator. Such a real time display will be discussed in more detail below. Another option is a Pause button 232 which causes processing section 20 to at least momentarily stop collecting noise information in the current interval, responsive to an actuation from the user. The pause function is implemented by step 234 of FIG. 6. Once the pause mode is entered, this step causes device 10 to monitor button 232 for another user interaction. In the pause mode, screen 16 can provide a "PAUSED" indication to the operator which can flash and button 232 can display "RESUME". At the same time, device 10 can provide an aural indication to bring the operator's attention to the paused status of the device such as, for example, a periodic beep. Responsive to detection of another operator actuation of button 232, operation in FIG. 6 moves to 240 where the noise measurement resumes for the current interval. At 242, responsive to the conclusion of the current noise interval, the measured noise value can be saved along with movement information, if movement information is recorded. It should be appreciated that the noise information and optional movement information can be stored in volatile memory for processing purposes. At 244, the noise information is converted to the frequency domain to establish the frequency content of the electromagnetic noise for the current interval. The frequency content can be represented as noise power versus frequency.

The conversion can be performed in a well known manner such as, for example, by using a Fast Fourier Transform (FFT). It should be appreciated that another embodiment, yet to be described, does not require the use of a time domain to frequency domain transform. Based on the results of the conversion, at 246, a power spectrum of the noise is established in the frequency domain for the current interval. This power spectrum can be displayed as will be further discussed below. At 248, a noise value can be established for each frequency of interest. In the present example, the frequencies of interest are 12 KHz, 19 KHz and 33 KHz. At 250, the noise values for the frequencies of interest can be scaled and saved. At 252, the real time noise can be displayed on display 16 of FIG. 1. While the noise values correspond to the current interval, it should be appreciated that the interval duration can be so short that the noise display appears to be continuous at least from a practical standpoint. For example, an interval duration of approximately 0.1 seconds is essentially imperceptible to the operator and provides for monitoring sufficiently low frequencies. Display of the noise information will be described in detail immediately hereinafter for a number of positions along the measurement path.

Referring to FIG. 9 in conjunction with FIGS. 2 and 3, display 16 is illustrated for an operator selection of the real time display at position $x_1$ of FIG. 3. The display is presented in a bar graph form having a horizontal axis 300 that represents frequency and a vertical axis 302 that represents noise power on a 0-10 scale. A 12 KHz bar 304 extends to about 7.1 on the noise scale, a 19 KHz bar 306 extends to about 3.05 on the noise scale and a 33 KHz bar 308 extends to about 4.8 on the noise scale. A peak value 310 for 12 KHz is indicated by an asterisk for bar 304 as well as an average value 312 for 12 KHz which is indicated by a triangle in the body of bar 304. It is noted that peak and average values can be displayed for each frequency although such values have not been shown for the remaining frequencies and in related figures for purposes of illustrative clarity. The peak and average values can be determined in any suitable manner, for example, by using the techniques that are described herein. In one embodiment, a plot 316 of noise power of the electromagnetic noise versus frequency can be determined and display 16 can be configured for illustrating this plot. In the present example, plot 316 represents average noise power although peak noise power is just as readily displayable but has not been shown for purposes of maintaining illustrative clarity. Thus, the power spectrum of the noise can be represented in terms of the average frequency content, as noise power, plotted against frequency from noise data obtained during a measurement period. The measurement period can correspond to a single interval, as discussed in conjunction with FIG. 6, or some combination of intervals with each measurement interval contributing a set of noise data to a combined or overall set of noise environment information.

Display 16 of FIG. 9 also includes a first threshold 320 and a second threshold 322 which are not required to be shown on the display but have been shown for descriptive purposes. It is noted that the specific levels for the noise thresholds can be based on information that is entered in step 202 of FIG. 6. Such information can include, but is not limited to, the intended depth for the transmitter during the subsequent operational procedure as well as the transmission power and frequency for each transmitter that is available. It should be appreciated that color can be used to emphasize the noise values in relation to the thresholds, but such color has not been provided due to illustrative constraints. In cases where this information is not entered by the operator, device 10 need not display thresholds. In the present example, the region below first threshold 320 can be considered as a low noise region such that a bar that peaks in this region can be presented as green in color. The region between first threshold 320 and second threshold 322 can be considered as a moderate noise region such that a bar that peaks in this region can be presented as yellow in color. In this regard, bars 306 and 308 would both be presented in yellow. The region above second threshold 322 can be considered as a high noise region such that a bar that peaks in this region can be presented as red in color. Accordingly, bar 304 would be presented as red in color. The various noise ranges can be characterized, for example, in the instance of using a monochrome display, by using hatching within the noise bars or using gray scale values where the shading of the bar corresponds to its associated noise value. It is noted that the pause mode can be entered by the operator using pause mode button 232 in FIG. 9. Moreover, other options can be provided to the operator using buttons on the display screen. Selection of the pause mode can return display 16 to the appearance of FIG. 8.

Referring to FIG. 9, it should be appreciated that display 16 may present the real time noise information in a wide variety of ways while remaining within the scope of the teachings herein. For example, a bar graph format can be modified such that the bars are immediately side by side and each bar includes a numerical frequency designation. Further, a bar graph format is not required. In one approach, the display can rely entirely on a numerical presentation which essentially lists each frequency and its associated noise value or can use any other suitable form of graphical representation.

FIG. 10 illustrates display 16 for an operator selection of the real time display at position $x_2$ of FIG. 3. The 12 KHz bar 304 extends to about 1.8 on the noise scale and can be green in color based on threshold 320, 19 KHz bar 306 extends to about 3.2 on the noise scale and can be yellow in color and 33 KHz bar 308 extends to about 8.9 on the noise scale and can be red in color.

FIG. 11 illustrates display 16 for an operator selection of the real time display at position $x_3$ of FIG. 3. The 12 KHz bar 304 extends to about 2.9 on the noise scale and can be green in color based on threshold 320, 19 KHz bar 306 extends to about 3.8 on the noise scale and can be yellow in color and 33 KHz bar 308 extends to about 5.7 on the noise scale and can be yellow in color.

Referring to FIGS. 4-6 and 8, upon reaching stop point 114 (FIG. 4), the operator selects a "Stop Noise Measurement" button 400 (FIG. 8) on display 16. In response, step 402 (FIG. 6) terminates collection of noise data. Thereafter, at 404, the average noise power for each of the frequencies of interest is determined based on the information that is stored for the time intervals that have occurred during movement of device 10 along the measurement path. In performing this determination, movement information measured in optional step 242 can be used to weight the noise information to account for a lack of movement by the operator which would tend to disproportionately emphasize at least some of the intervals. In the alternative, before the user terminates the noise measurement, step 402 causes device 10 to enter the next measurement interval at 405 and refers operation back to step 220 for the next measurement interval.

Referring to FIGS. 6, 12 and 13, at 406, the operator can be presented with an option on screen 16 (FIG. 12) to use an auto-select mode for automatically choosing one of the frequencies. In order to use the auto-select mode, the user chooses a "Yes" button 410 (FIG. 12). Responsive to this selection, in one embodiment, step 412 of FIG. 6 compares the average noise power for each frequency and identifies the one having the lowest value. Step 414 then indicates the selected frequency on display 16, for example, as illustrated by FIG. 13, as indicated by the reference number 416. In the present example, the auto-selected frequency is 12 KHz for reasons that will be evident on the basis of further discussion of the specific values for the average noise powers which follows hereinafter. In another embodiment, auto-select can take into account the noise value for each frequency as it relates to thresholds. For example, a frequency having a peak value at any point along the measurement path exceeding second threshold 322 (see FIG. 9, as one example for the 12 KHz frequency) or remaining above the second threshold for longer than a predetermined period of time can be excluded from availability for selection as the transmission frequency. As another example, auto-select can favor a particular frequency for selection as the transmission frequency when the particular frequency remains below first threshold 320 for a longer period of time relative to other frequencies. The frequency selection can weight noise behavior relative to the thresholds. For example, the frequency selection can weight noise behavior relative to first threshold 320 as being of more importance than noise behavior relative to second, upper threshold 322. In other embodiments, the user may mark positions of obstacles and/or other points of interest, for example, using a touch screen display, such that a proposed drill path can be presented on the display with the designated obstacles and associated noise values. In this regard, knowing that the noise value for a given frequency is above second threshold 322 proximate to an obstacle could be a factor in electing not to use that given frequency as the transmission frequency. On the other hand, exceeding second threshold 322 proximate to a pit at an end point of a drill path could be ignored. In any embodiment, the auto-select feature can default to a manual selection mode whenever the selection parameters that are being employed do not provide a sufficiently determinative result. For example, all of the frequencies might have exceeded second threshold 322 and are otherwise relatively close in average noise value.

Display 16 of FIG. 13 provides the operator with the option of switching to a manual mode using a button 417 which will result in a display of the average and peak noise powers for each frequency. Of course, if the operator wishes to make his or her own decision on the best noise value, the operator can select "No" button 418 which can result in the immediate display of the average and peak noise powers. The display screen in FIG. 13 also provides a button 419 for leaving the noise measurement/setup mode and entering the locating mode in a dual mode device.

Attention is now directed to FIGS. 6 and 14. If the operator chooses not to use the auto-select feature, step 420 causes the generation of display 16 as it can appear in FIG. 14. Peak noise and average noise power values are shown for each frequency. The peak noise value for a given frequency can be determined, for example, based on the measurement interval that exhibits the highest noise power. Of course, determination of the peak noise power can be monitored and updated on an ongoing basis. The peak noise values are shown by flags 501, 502 and 504 corresponding to 12 KHz, 19 KHz and 33 KHz, respectively. The peak for 12 KHz is at approximately 7.1, the peak for 19 KHz is at approximately 3.6 and the peak for 33 KHz is at approximately 8.9. The average noise power for each frequency is indicated by bars 506, 508 and 510 corresponding to 12 KHz, 19 KHz and 33 KHz, respectively. The average noise value for 12 KHz is approximately 2.2, the average noise value for 19 KHz is approximately 2.8 and the average noise value for 33 KHz is approximately 5.0. It is of interest to note that, while 12 KHz has the lowest average noise value, the lowest peak noise value is exhibited by 19 KHz. In this regard, it may be of interest to the operator to know where each peak noise value occurred along the measurement path. In one embodiment, device 10 can track this information and indicate such a position for each noise peak, for example, adjacent to each flag on display 16. In FIG. 14, the x axis position of each peak is indicated for 12 KHz, 19 KHz and 33 KHz as 500, 900 and 650 feet, respectively. The operator can compare the locations of these peaks to the locations of any inground obstacles along the intended path in order to insure that location accuracy is maintained in the area of the obstacle. In the present example, utility 130 (see FIGS. 4 and 5) is located at about 450 feet, very near the peak noise value for 12 KHz. In such a situation, the operator might elect to use a transmitter frequency other than 12 KHz even though 12 KHz exhibits the lowest average noise power. The operator may recall that the real time display at position $x_1$, illustrated by FIG. 9, showed that 19 KHz exhibited the lowest noise proximate to obstacle 130. Of course, the operator can return to position $x_1$ and repeat the real time noise measurement. As another example, the operator may consider accuracy in approaching stop point 114 to be of prime importance. In this case, the operator can elect to select 12 KHz as the transmitter frequency based on the display at position $x_3$ (FIGS. 3 and 11). Of course, the operator may select 12 KHz solely on the basis of exhibiting the lowest average noise value.

Referring to FIG. 14, it should be appreciated that color coding, hatching and/or shading can be used to emphasize the peak and average noise values relative to thresholds 320 and 322 in any suitable manner. For example, average value noise bars 506 and 508 can be green in color while average value noise bar 510 can be yellow. Peak noise flags 501 and 504 can be red whereas peak noise flag 502 can be yellow. In one embodiment, the operator can select a display feature which plots the noise power for a selected one of the transmitter frequencies against the x axis. This plot can appear, for example, in the form of one of the line plots taken from FIG. 4 on display 16.

Attention is now directed to FIG. 15 which is a flow diagram that illustrates another embodiment of a method, generally indicated by the reference number 200', for the operation of device 10. It is noted that method 200' shares a number of steps with method 200 of FIG. 6. Accordingly, descriptions of these shared steps will not be repeated for purposes of brevity and the reader is referred to the discussions above. What is different, however, resides in the use of a technique in FIG. 15 which establishes the noise at one or more given transmitter frequencies. In one embodiment, a noise measurement is taken, for example, using a tunable narrowband receiver circuit that is successively tuned to each frequency of interest. In other embodiments, digital filter technology can be applied which results in the determination of a noise measurement at a discrete frequency, as opposed to a noise determination across a frequency spectrum.

Method 200' starts with aforedescribed step 202 in which transmitter frequency, power and target depth information can be entered by the operator, for example, as described above. At 600, device 10 is set up to receive the first frequency of interest. This can be any of the frequencies but generally will be either the lowest or the highest frequency for purposes of simplicity. In the present example, it is assumed that the lowest frequency, 12 KHz, is the first frequency with 19 KHz and 33 KHz serving as the second and third frequencies, respectively. Generally, in one embodiment, a discrete Fourier transform (DFT) can be applied to determine the noise that is present at the frequency of interest. It should be appreciated that any suitable technique can be employed including, for example, the Goertzel filter or, as another example, wavelet transformation. At 602, device 10 enters a measurement mode in which noise measurement takes place. Step 234 then implements a pause feature that is described above and which causes noise measurement to suspend and resume responsive to user interactions. At 604, noise measurement and movement monitoring takes place for the current frequency. The measured noise value is saved at 606 along with movement information for the current frequency. As discussed above, movement information is optional, but can be used to weight the data in determining average noise values over the extents of the measurement path. At 610, a decision is made as to whether another frequency is to be monitored. If that is the case, the frequency is incremented at 612 to the next frequency of interest and operation repeats starting at 600 for the next frequency as the new current frequency. If, on the other hand, measurements have been made for all frequencies of interest for the current interval, operation moves to step 250 which scales the noise values and saves them for the current interval. Accordingly, step 606 sequentially generates a set of noise environment information which encompasses all of the frequencies that are of interest. Step 252 provides for display of the values from the current interval in the form of a real time display, as described above, to provide the operator with the opportunity to continuously monitor the noise readings along the measurement path. Each interval along the measurement path is handled in this manner until data collection is terminated at 402. The remainder of the procedure executes in a manner that is consistent with the descriptions above. The various presentations on display 16, as described above, are readily implemented using the technique of FIG. 15.

Referring to FIG. 1, in an embodiment where device 10 is operable in the dual modes of noise measurement and locating, it may be advantageous to use the same antenna and receiver circuitry in both modes. That is, antenna 11 and receiver section 17 can be used in both modes. In this way, it is not necessary to determine the sensitivity of the antenna and receiver combination as a function of frequency, since the noise environment and the locating signal are measured with the same components. In other words, the sensitivity will be the same for both measurements.

It should be appreciated that device 10 can readily be used for purposes of surveying the noise environment when the operational procedure that is to be performed is a cable locating procedure. For example, the operator can use a measurement path that is based on what is thought to be a projection of the cable onto the surface of the ground. Of course, the operator can enter frequencies that are available for use as the cable locating frequency. It should be appreciated, however, that the application of the cable locating frequency can give rise to false locating signals that will not be present during the noise survey. One highly advantageous system and method which essentially eliminates the effects of false cable locating signals that arise during a cable locating procedure is described in U.S. Pat. No. 7,151,375 entitled DISTINGUISHING FALSE SIGNALS IN CABLE LOCATING which is commonly owned with the present application and incorporated herein by reference in its entirety.

Turning to FIG. 16, display output options can be provided to the operator responsive to step 420 of FIGS. 6 and 15. At step 420, screen 16 can provide a number of options to the user that are selectable in any suitable manner such as, for example, those described above. One selection, for example, is indicated by the reference number 450 and allows the user to choose a bar graph display that can be the display of FIG. 14.

Referring to FIG. 17, in conjunction with FIG. 16, a selection 452 allows the user to select the display of noise power corresponding to one or more individual and previously selected transmitter frequencies which can appear, for example, as shown in FIG. 17 with noise power plotted against distance. Accordingly, a plot of the power spectrum of the electromagnetic noise versus distance for each of the selected frequencies is provided and displayable.

Turning now to FIG. 18 in conjunction with FIG. 16, another selection 454 provides for the display of a noise map 456. Such a noise map can include frequency plotted against distance with the noise value at any given position on the map being shown using color, gray scale shading or contour lines that represent constant values of noise power. In the present example, contour lines 458 have been used as a result of illustrative constraints that are associated with the present forum. A large area of the map exhibits white noise which is designated at several positions using the reference number 460. Noise peaks 462 and 464, however, are seen on map 456 such that the user may select a transmitter frequency 470, shown using a dashed line, for an inground operation to be performed in the region corresponding to map 456 which avoids the noise peaks. FIG. 16 further provides a selection 474 which allows the user to return to the auto-select mode and may provide the display shown in FIG. 13.

In view of the foregoing, a device is provided for use in conjunction with a system in which a transmitter is moved through the ground in a region during an operational procedure which can involve an underground transmitter that transmits a locating signal or an underground cable that transmits the locating signal. The signal has a transmission frequency that is selectable as one discrete frequency from a group of discrete frequencies. As one example, the selected transmission frequency can be chosen based on the availability of sondes that are at hand which can be housed in an underground device such as a boring tool or a pullback arrangement wherein each available sonde is configured for transmitting at a different discrete frequency. As another example, a given sonde may be tuned or set to transmit at the selected discrete transmission frequency. As yet another example, a given sonde may be configured to simultaneously transmit multiple ones of the discrete frequency and a cooperating receiver can be tuned to receive only the selected discrete transmission frequency. In the instance of cable locating, an above ground transmitter can be configured to cause a desired cable to emit a frequency of interest. Accordingly, in a suitable manner, the transmission frequency can be set to one of a plurality of discrete transmission frequencies that are spaced apart in a transmission frequency range. The region includes electromagnetic noise that can vary within the region and across the transmission frequency range. The portable device described herein generally includes a receiver having a receiver bandwidth that at least includes the transmission frequency range for measuring the electromagnetic noise at least in the transmission frequency range to establish a frequency content of the electromagnetic noise for use in selecting one of the discrete transmission frequencies as a selected transmission frequency that is subsequently transmitted during the operational procedure.

It may be desirable to determine and display for the user information concerning the maximum usable depth of a transmitter at given points along and/or associated with a borepath or other inground path for reliable data reception, in light of the noise that is present. One embodiment of a technique for determining maximum usable depth will be described immediately hereinafter.

Initially, a perfectly coherent receiver is assumed where the carrier has been coherently demodulated and the bit/symbol timing and the packet synchronization pattern(s) has been perfectly tracked. The resulting baseband data can be optimally decoded as shown in the process diagram of FIG. 19a. The baseband data can be represented mathematically as follows:

$$r(t)=S_i(t)+v(t); \quad i=\{0,1\} \tag{1}$$

where r(t) is the received signal, in voltage, and t is the time in seconds as used throughout the equations presented herein. The function $S_i(t)$ is a Manchester encoded baseband data waveform illustrated in the diagrammatic plots of FIGS. 19b and 19c showing signal amplitude in voltage versus time and in which the waveforms for bit 1 and bit 0 are shown, respectively. Although Manchester encoding is used in the context of the present descriptions, it should be appreciated that any suitable type of encoding may be employed. Moreover, it is considered that one having ordinary skill in the art can readily apply the teachings brought to light herein to other forms of encoding with this overall disclosure in hand.

The transmitted data can be assumed to be corrupted by an Additive White Gaussian noise (AWGN), v(t). If the AWGN has a normal distribution (i.e. Gaussian with a mean value of 0) with power $\alpha^2$, then the Probability Density Function (PDF) can be expressed as:

$$f(v) = \frac{e^{\frac{-v^2}{2\alpha^2}}}{\sqrt{2\pi\alpha^2}} \tag{2}$$

where:
f=the probability density function (PDF),
v=noise random variable,
e=the exponential function,
$\alpha^2$=power of the noise random variable v (before match filtering).

The Bit-Error-Rate (BER) is a measure of the rate of decoded bits that are in error. For example, if BER=0.01, then on average, the decoder produces 1 bit error for every 100 bits it decodes.

Given the conditions above, the probability of decoding a bit in error is given as:

$$P(\text{Error})=1-P(\text{Correct}) \tag{3}$$

Henceforward, the word "Error" may be abbreviated as "E" and the word "Correct" may be abbreviated as "C". Let $y_k(T_B)=\gamma$ when the decoder decodes a bit $S_i$. Then the probability of correctly decoding a transmitted bit $S_i$ is expressed as:

$$P(S_i|y_k=\gamma)=\int_L f_y(\gamma|S_i)d\gamma \tag{4}$$

where:
$y_k$=the output of the match filter (in volts) as shown in FIG. 19a.
k=the $k^{th}$ bit of the receiving data sequence.
$T_B$=bit period time (in seconds, see FIGS. 19b and 19c)
B="bit"
L=Limits of integral
$\gamma = y_k(T_B)$
d=denotes a derivative operation.

Then, the total probability of correctly decoding the bits is:

$$P(C) = P(S_0)\int_a^\infty f_\gamma(\gamma|S_0)d\gamma + P(S_1)\int_{-\infty}^a f_\gamma(\gamma|S_1)d\gamma \qquad (5)$$

where a=0 is appropriate for the baseband waveforms discussed here. Next:

$P(S_i)$=Probability that a bit $S_i$ was transmitted from the sonde; (6a)

with i={0,1}
and, $$P(S_0) + P(S_1) = 1 \qquad (6b).$$

Equation (5) can be expressed in terms of the noise $v_k$ with a power of $\sigma^2$ as:

$$P(C) = P(S_0)\int_a^\infty f_v(\gamma - S_0|S_0)d\gamma + P(S_1)\int_{-\infty}^a f_v(\gamma - S_1|S_1)d\gamma \qquad (7)$$

where:
$\sigma^2$=noise power after match filtering.

Substituting Equation (2) into Equation (7), and then Equation (7) into Equation (3), and replacing the "1" in Equation (3) with Equation (6b), one arrives at:

$$P(E) = \qquad (8)$$
$$P(S_0)\left(1 - \int_a^\infty \frac{e^{-\frac{(\gamma-S_0)^2}{2\sigma^2}}}{\sigma\sqrt{2\pi}}d\gamma\right) + P(S_1)\left(1 - \int_{-\infty}^a \frac{e^{-\frac{(\gamma-S_1)^2}{2\sigma^2}}}{\sigma\sqrt{2\pi}}d\gamma\right).$$

Let $$\alpha = \left(\frac{\gamma - S_0}{\sigma}\right) \qquad (9a)$$

and, $$\beta = \left(\frac{\gamma - S_1}{\sigma}\right). \qquad (9b)$$

Then $$d\alpha = \frac{1}{\sigma}d\gamma \qquad (10a)$$

and, $$d\beta = \frac{1}{\sigma}d\gamma. \qquad (10b)$$

Substituting Equations (9a), (9b), (10a), and (10b) into Equation (8) yields:

$$P(E) = P(S_0)\left(1 - \int_{\frac{a-S_0}{\sigma}}^\infty \frac{e^{-\frac{\alpha^2}{2}}}{\sqrt{2\pi}}d\alpha\right) + P(S_1)\left(1 - \int_{-\infty}^{\frac{S_1-a}{\sigma}} \frac{e^{-\frac{\beta^2}{2}}}{\sqrt{2\pi}}d\beta\right) \qquad (11)$$

Let Q(x) denote the tail integral of the Gaussian PDF as:

$$Q(x) \triangleq \int_x^\infty \frac{e^{-\frac{\theta^2}{2}}}{\sqrt{2\pi}}d\theta \qquad (12)$$

where:
$\theta$=a Gaussian random variable.

Then Equation (11) can be expressed in terms of Equation (12), as follows:

$$P(E) = P(S_0)\left(1 - Q\left(\frac{a-S_0}{\sigma}\right)\right) + P(S_1)\left(1 - Q\left(\frac{S_1-a}{\sigma}\right)\right). \qquad (13)$$

Note that:

$$Q(-x) \equiv 1 - Q(x) \qquad (14).$$

Hence, Equation (13) can be rewritten as:

$$P(E) = P(S_0)Q\left(\frac{S_0-a}{\sigma}\right) + P(S_1)Q\left(\frac{a-S_1}{\sigma}\right). \qquad (15)$$

Let $(S_0) = P(S_1) = \frac{1}{2}$, and since $S_1^2 = S_0^2 = S^2$ are identical (energy-wise), hence $S_0 = S_1 = S$. Equation (15) therefore reduces to:

$$P(E) = Q\left(\sqrt{\frac{1}{2}\left(\frac{S}{\sigma}\right)^2}\right). \qquad (16)$$

Since $$Q(x) \triangleq \frac{1}{2}\text{erfc}\left(\frac{x}{\sqrt{2}}\right) \qquad (17)$$

Equation (16) can be re-written, as follows:

$$P(E) = \frac{1}{2}\text{erfc}\left(\sqrt{\frac{S^2}{4\sigma^2}}\right) \qquad (18)$$

Since $$S^2 \triangleq E\{y_k^2\}; \forall k \qquad (19)$$

where E{.} denotes the expected value (i.e. statistical mean of {..}) of the random variable inside the bracket, where $y_k$ and $\sigma^2$ are defined as:

$$y_k^2 = \int_{kT_B}^{(k+1)T_B}\left(\sqrt{\frac{P_T}{T_B}}\right)^2 dt = \frac{1}{2}P_T \qquad (20a)$$

$$\sigma^2 = \frac{N_0}{2}\int_{-\infty}^\infty |H(f)|^2 df = \frac{N_0}{2}R_B \qquad (20b)$$

where H(f) is the Fourier transform of the match filter h(t) which is shown in FIG. 19a as an integrate and dump. Substituting Equations (20), (21a) and (21b) into Equation (19) yields:

$$P(E) = \frac{1}{2}\text{erfc}\left(\sqrt{\frac{1}{4}\left(\frac{P_T T_B}{N_0}\right)}\right) \qquad (21)$$

Equation (22) can be re-written in terms of bit signal-to-noise ratio ($E_B/N_o$) as follows:

$$P_e\left(\frac{E_B}{N_0}\right) \equiv P(E) = \frac{1}{2}\text{erfc}\left(\sqrt{\frac{1}{4}\frac{E_B}{N_0}}\right) \quad (22a)$$

where $$E_B = P_t T_B \quad (22b)$$

Equation (22a) gives the BER as a function of bit signal-to-noise ratio $E_B/N_o$. FIG. 19d is a plot that shows the BER for a range of $E_B/N_o$ based on Manchester encoded OOSK (On-Off-Shift-Keying). Using the plot in FIG. 19d, one can determine the roll range of the receiver. For example, to decode the roll packet from a transmitter that has 7 bits for data (not counting the synchronization bits) one would need to have $$P_e < \frac{1}{7}.$$

The plot in FIG. 19d shows that one would need $$\frac{E_B}{N_0} > 3.7 \text{ dB}.$$

The range for roll data can be estimated under the assumption that the noise characteristic is the same within the operating radius of the system. Furthermore, it is assumed that the amplitude of the transmitted signal decays by $1/d^3$ for a dipole transmitting antenna, where d is the distance between the transmitter and the receiver's antenna. The power of the signal ($S^2$) is a function of distance, d, as follows:

$$S^2(d) = \left(\left(\frac{d}{d_0}\right)^{-3}\right)^2 S_0^2(d_0) \quad (23)$$

where $S_0^2(d_0)$ is the value of $S_0^2$ measured at a distance $d_0$. Using Equation (20a), one can re-write Equation (23) as follows:

$$P_T = 2\left(\frac{d}{d_0}\right)^{-6} S_0^2(d_0) \quad (24)$$

Using equation (22b) and dividing Equation (24) by $N_0$, one arrives at:

$$\frac{E_B(d)}{N_0} = 2\left(\frac{d}{d_0}\right)^{-6}\frac{S_0^2(d_0)T_B}{N_0} \quad (25)$$

Solving for d yields:

$$\hat{d} \leq d_0\left(\frac{1}{2}\right)^{-1/6}\left(\frac{E_B}{N_0}\right)^{-1/6}\left(\frac{N_0}{S_0^2(d_0)T_B}\right)^{-1/6} \quad (26)$$

The variable d in Equation (26) gives the estimated maximum distance for decodable roll data as a function of $$\frac{E_B}{N_0},$$

which corresponds to a particular value of BER. Using the example described earlier: To detect the 7-bit roll packet one will need $P_e$ (i.e. BER) to be less than 1/7 for which, according to the chart in FIG. 19d, one would need to have $$\frac{E_B}{N_0} > 3.7 \text{ dB}.$$

To determine $\hat{d}$ using Equation (26), one would need to know $d_0$, $N_0$, and $S_0^2(d_0)$. To measure $d_0$ and $S_0^2(d_0)$, one can place the transmitter as close to the receiver's antenna as possible without saturating any analog circuitry in the receiver. The value of $d_0$ can be measured directly. Then $S_0^2(d_0)$ can be evaluated using Equation (19) and Equation (20a). At this short distance, the signal power will be much stronger than the noise power, so one can neglect the noise power in the $S_0^2(d_0)$ measurement. FIG. 19e is a process diagram that graphically illustrates Equations 19 and 20a for estimating $S_0^2(d_0)$. The quantity $N_0$ can be determined with the transmitter turned off. FIG. 19f is a process diagram that graphically illustrates how $N_0$ is determined. Also, once the noise power is estimated, if desired, one can subtract the estimated noise power from estimated noise power in $S_0^2(d_0)$ that was previously determined as having an influence that is generally negligible.

As an example, assume a transmitter is placed 47 inches away from a receiver (i.e. $d_0$=47 inches) and the receiver measures $S_0^2(d_0)$=0.09 Volts$^2$. Then, the transmitter is turned off and $N_0$ is measured, for which a value of $N_0$=6.821×10$^{-12}$ Volt$^2$/Hz is obtained. Assuming that the distance, $\hat{d}$, is one at which the roll packet, which has 7 bits can still be decoded, $$P_e < \frac{1}{7}$$

which, from FIG. 19d, requires $$\frac{E_B}{N_0} > 3.7 \text{ dB}.$$

Substituting $d_0$, $N_0$, $S_0^2(d_0)$, and $$\frac{E_B}{N_0} = 3.7 \text{ dB}$$

into Equation (26), the estimated range is $\hat{d} \leq 1116.9$ inches (or equivalent=93.1 feet) at which the roll packet can be decoded.

It is noted that for purposes of the discussion immediately above, a perfectly coherent demodulation of the carrier and perfect knowledge of the bit timing and of the packet synchronization is assumed. Further, it is assumed that the detection of the baseband data is performed using match filtering. Any deviation from these assumptions can be accommodated by using a higher $E_B/N_0$ value to achieve the same $P_e$ value. In some cases, the system may be too complex to reasonably analyze; in that case, one can resort to computer simulation to determine the BER (i.e. $P_e$) performance as a function of the $E_B/N_0$ value as shown in FIG. 19d, and then use Equation (26) to estimate the range of the receiver.

Equation 26 can be used for purposes of determining maximum operational depth on an on-the-fly basis by using certain values, as determined above, in conjunction with a current noise reading. This can be accomplished by treating $$\left(\frac{E_B}{N_0}\right)^{-1/6}$$

as a constant that is determined with the transmitter and receiver separated by distance $d_0$ and substituting the current value for noise as $N_0$ in the expression $$\left(\frac{N_0}{S_0^2(d_0)T_B}\right)^{-1/6}$$

while treating the remainder of the expression as a constant with values determined, as discussed above, with the transmitter and receiver separated by distance $d_0$.

With reference to FIG. 19g, a flow diagram for use in establishing a predicted maximum usable depth is generally indicated by the reference number 600. Initially at 602, the predicted operational depth determination procedure is initiated, for example, by a user. The selection to enter procedure 600 for determining this depth may be provided, for example, as a button 604 in the real time noise displays of FIGS. 9-11, although this option may be provided to the user at any suitable time so long as noise data is available to form the basis of the analysis. At 610, one or more transmitter frequencies of interest are identified. As one example, the frequencies of 12 KHz, 19 KHz and 33 KHz may be identified as potential transmitter frequencies. The user may identify that the list of frequencies will remain unchanged for repetition of this process at subsequent positions. At 612, noise data is collected, for example, using antenna 11 of FIG. 1 in a range that includes a current one of the frequencies of interest. In one embodiment, the noise environment to which antenna 11 is subjected can be filtered using digital filtering by receiver section 12 to define a detection band at least approximately centered on the current frequency and sufficiently broad to include encoding of interest such as, for example, pitch and roll data, among other potential parameters. In one embodiment, the digital filter can be the data detection filter that is used for purposes of recovering modulated data such as pitch and roll data during operation as a locator. The data detection filter can be characterized as having a detection bandwidth that is at least approximately centered on the current frequency of interest. In another embodiment, this digital filter can have a wider bandwidth than the data detection filter. It should be noted that the use of digital filtering, as described, does not require the use of a time domain to frequency domain transform. Because the digital filter includes a filter bandwidth that can be centered on the current frequency, the noise at the current frequency and generally within some limited surrounding frequency range can be detected. The surrounding range can be relatively narrowed or broadened as desired. Such digital filtering technology is well known as taught, for example, by Digital Communication Techniques: Signal Design and Detection by Marvin K. Simon, Sami M. Hinedi, and William C. Lindsey, Chapter 4, pages 178-190 (ISBN 0-13-200610-3), which is incorporated herein by reference.

At 614, using Equation (26) and the measured noise value or values as $N_0$, a predicted maximum value for operational depth can be determined at which depth or range the information that is to be encoded on the transmitter signal will be decodable.

Referring to FIGS. 19g and 20, having determined the predicted maximum usable operational depth for reliable data reception for one identified frequency of interest, at 618, it is then determined whether another frequency is identified for which the determination is to be made. If the process has been executed for all of the identified frequencies, at 620, the information is displayed as shown, for example, in the screen shot of FIG. 20 where the predicted depth for a 12 KHz transmitter is 41 feet, the predicted depth for a 19 KHz transmitter is 20 feet and the predicted depth for a 33 KHz transmitter is 11 feet. At 622, operation can return, for example, to step 252 of FIG. 6 responsive to selection of a RESUME button 624 on display 16 of FIG. 20. If, on the other hand, another frequency remains for which the predicted depth determination has been requested, at 626, the current frequency is set to the next identified frequency and execution returns to step 612 for the new current frequency.

Attention is now directed to FIG. 1 for purposes of describing another embodiment for determining the predicted maximum usable operational depth for reliable data reception. In this regard, FIG. 1 includes a simulation transmitter 700, having a simulation antenna 702 which selectively transmits a simulation signal 704 with modulated simulation data. It should be appreciated that the simulation signal is received by antenna 11 along with any environmental noise. Simulation transmitter 700 is configured to transmit signal 704 in a way which mimics or simulates an actual inground transmitter that is transmitting a modulated signal from a given depth and based on characteristics such as, for example, calibration constant k, all of which can be specified by the user in step 202 of FIG. 6 for each transmitter of interest. The simulation antenna can be of the same type as the antenna that is used by the inground antenna. In the present example, a dipole antenna may be used. In the illustrated embodiment, the simulation antenna is shown in a spaced apart relation from antenna 11. In another embodiment, the simulation antenna can be co-located with antenna 11, although this embodiment does not readily admit of illustration and therefore has not been shown. The simulation process, like the process of FIG. 19, can be entered, in one embodiment to be described immediately hereinafter, from real time noise displays such as those of FIGS. 9-11, by the user selecting MAX DEPTH button 604.

Turning now to FIG. 21, another embodiment of a method for determining the predicted maximum usable operational depth for reliable data decoding is generally indicated by the reference number 720. At 722, the user can be queried for use in determining the transmitter frequencies of interest. The screen shot of FIG. 22 illustrates one embodiment for this query in which the user can confirm that the current specified frequencies are to be used at 724 or if the frequency list is to be modified at 726. This latter choice can return the screen to the type of frequency selection process that is exemplified by FIG. 7. Further, the user can select a QUIT button 728 to exit the depth determination procedure.

Referring to FIG. 1 in conjunction with FIG. 21, at 730 and after having identified the frequencies of interest, the simulation transmitter is set to mimic transmission of the first frequency of interest at an initial depth and initiates transmission. In one embodiment, the initial depth can be specified as a shallow depth that is expected to yield reliable transmission such as, for example, 10 feet or less. At 732, the simulation signal and noise are received by receiver 12 via antenna 11 to form collected data. At 734, processing section 20 subjects the collected data to the same decode process that is normally used to decode transmissions. At 736, a determination is made as to whether the data was decodable from modulated simulation signal 704. In one embodiment, the decoding results are acceptable only if an exact recovery of the simulated modulation data is accomplished. In other embodiments, a threshold can be established, for example, in terms of bit error rate such that the result is acceptable only if the bit error rate is less than or equal to the threshold value. If the decoding result is acceptable, at 738, the depth is increased by an increment ΔD. As one example, ΔD can be set as one foot. The process then repeats beginning with step 732 and determines if the signal is decodable. It should be appreciated that the modulation on the simulation signal may remain unchanged irrespective of the depth that is being simulated since all that is necessary is to test for successful decode of known data. The depth is incremented in this manner until step 736 identifies a depth for which the signal is not decodable. At 740, the depth corresponding to the last acceptably decodable signal for the current frequency is saved. At 744, if another transmission frequency remains to be simulated, step 746 is entered which changes the simulation signal to reflect the new frequency, based on specified transmitter parameters, and resets the depth to a selected initial shallow value, as discussed above. The process then repeats until a depth value has been determined for each frequency. It should be appreciated that the data that is modulated on the simulation signal may remain identical irrespective of other adjustments in the simulation signal such as, for example, changing its signal strength in order to mimic transmission from a greater depth. Further, the same data may likewise be modulated on the simulation signal for every transmitter frequency that is mimicked.

Referring to FIGS. 20 and 21, at 748, the depth values can be displayed on display 16, for example, as shown in FIG. 20. At 750, execution can be returned, for example, to step 252 of FIGS. 6 and 15 responsive to selection of RESUME button 624 in FIG. 20.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering the various sequences of which they are made up. Accordingly, having described a number of exemplary aspects and embodiments above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. An apparatus for use in preparing for an underground drilling procedure in which a transmitter transmits a transmitter signal while moving through the ground in a region during the underground drilling procedure and said region includes electromagnetic noise that varies within the region and causes interference with the transmitter signal, said apparatus comprising:
   a detector positioned at an above ground location to measure the electromagnetic noise in said region prior to said underground drilling procedure to establish a frequency content of the electromagnetic noise and to select a transmitter frequency based on the frequency content of the electromagnetic noise;
   a processor to determine a predicted maximum operational depth of the transmitter for subsequent reception of said transmitter signal at the above ground location during the underground drilling procedure based on the measured electromagnetic noise; and
   a display to indicate the predicted maximum operational depth at least prior to the underground drilling procedure.

2. The apparatus of claim 1 wherein said transmitter signal is transmitted during said underground drilling procedure at the transmitter frequency and wherein said processor establishes an average value of the electromagnetic noise at least at the transmitter frequency and, thereafter, establishes a threshold signal value for the transmitter signal based at least in part on the average value for use in establishing the predicted maximum operational depth.

3. The apparatus of claim 2 wherein said processor establishes a standard deviation of the electromagnetic noise and uses the standard deviation in conjunction with the average value to establish the predicted maximum operational depth.

4. The apparatus of claim 1 wherein said transmitter signal is transmitted at one of a plurality of different frequencies during the underground drilling procedure and wherein said processor establishes the predicted maximum operational depth of the transmitter for each one of the transmitter frequencies and said display displays the predicted maximum operational depth for each one of the plurality of different frequencies.

5. The apparatus of claim 1 wherein said transmitter signal is transmitted by said transmitter during said underground drilling procedure including modulation data and said apparatus includes a simulation transmitter to transmit a simulated transmission signal that is modulated by a simulated modulation data and to receive the simulated transmission signal along with the electromagnetic noise, and to determine the predicted maximum operational depth by modifying the simulated transmission signal to identify the predicted maximum operational depth based on decodability of the simulated modulation data.

6. The apparatus of claim 5 wherein the simulated transmission signal includes a simulation transmission frequency and wherein said processor modifies the simulated transmission signal by changing a signal strength of the simulated transmission frequency for a fixed value of the simulated transmission frequency to identify a threshold signal strength that represents a minimum signal strength at which the simulated modulation data is decodable such that said minimum signal strength defines the predicted maximum operational depth.

7. The apparatus of claim 6 wherein said processor changes the signal strength of the simulated transmission frequency by incrementally decreasing the signal strength beginning initially from a value at which the simulated modulation data is decodable.

8. The apparatus of claim 1 wherein said detector, said processor and said display form parts of a portable device.

9. The apparatus of claim 1 wherein said processor determines the predicted maximum operational depth based on an average value of the measured electromagnetic noise.

10. A method for use in preparing for an underground drilling procedure in which a transmitter transmits a transmitter signal while moving through the ground in a region during the underground drilling procedure and said region includes electromagnetic noise that varies within said region, said method comprising:
prior to said underground drilling procedure, measuring the electromagnetic noise in said region at an above ground location to establish a frequency content of the electromagnetic noise and to select a transmitter frequency signal based on the frequency content of the electromagnetic noise;
determining a predicted maximum operational depth of the transmitter for subsequent reception of said transmitter signal at the above ground location during the underground drilling procedure based, at least in part, on the measured electromagnetic noise; and
indicating the predicted maximum operational depth at least prior to the underground drilling procedure.

11. The method of claim 10 wherein said transmitter signal is transmitted during said underground drilling procedure at a transmitter frequency and wherein determining the predicted maximum operational depth includes establishing an average value of the electromagnetic noise at least at the transmitter frequency and, thereafter, establishing a threshold signal value for the transmitter signal based at least in part on the average value for use in establishing the predicted maximum operational depth.

12. The method of claim 11 wherein determining the predicted maximum operational depth includes establishing a standard deviation of the electromagnetic noise and using the standard deviation in conjunction with the average value to establish the predicted maximum operational depth.

13. The method of claim 10 wherein said transmitter signal is transmitted at one of a plurality of different frequencies during the underground drilling procedure and wherein said determining includes establishing the predicted maximum operational depth of the transmitter for each one of the transmitter frequencies and said indicating includes displaying the predicted maximum operational depth for each one of the plurality of different frequencies.

14. The method of claim 10 wherein said transmitter signal is transmitted by said transmitter during said underground drilling procedure including modulation data and said method further comprising transmitting a simulated transmission signal that is modulated by a simulated modulation data and said measuring includes receiving the simulated transmission signal along with the electromagnetic noise, and determining the predicted maximum operational depth includes modifying the simulated transmission signal to identify the predicted maximum operational depth based on decodability of the simulated modulation data.

15. The method of claim 14 wherein the simulated transmission signal includes a simulation transmission frequency and wherein modifying the simulated transmission signal includes changing a signal strength of the simulated transmission frequency for a fixed value of the simulated transmission frequency to identify a threshold signal strength that represents a minimum signal strength at which the simulated modulation data is decodable such that said minimum signal strength defines the predicted maximum operational depth.

16. The method of claim 15 wherein changing the signal strength of the simulated transmission frequency includes incrementally decreasing the signal strength beginning initially from a value at which the simulated modulation data is decodable.

17. The method of claim 10 wherein the predicted maximum operational depth is determined based on an average value of the measured electromagnetic noise.

* * * * *